United States Patent
Declercq et al.

(10) Patent No.: US 10,778,251 B2
(45) Date of Patent: Sep. 15, 2020

(54) METHOD AND APPARATUS FOR ENCODING QUASI-CYCLIC LOW-DENSITY PARITY CHECK CODES

(71) Applicant: Codelucida, Inc., Tucson, AZ (US)

(72) Inventors: David Declercq, Tucson, AZ (US);
Bane Vasic, Tucson, AZ (US); Benedict J. Reynwar, Tucson, AZ (US)

(73) Assignee: Codelucida, Inc., Tucson, AZ (US)

( * ) Notice: Subject to any disclaimer, the term of this patent is extended or adjusted under 35 U.S.C. 154(b) by 0 days.

(21) Appl. No.: 16/530,944

(22) Filed: Aug. 2, 2019

(65) Prior Publication Data
US 2020/0044667 A1 Feb. 6, 2020

Related U.S. Application Data

(60) Provisional application No. 62/714,607, filed on Aug. 3, 2018.

(51) Int. Cl.
*H03M 13/11* (2006.01)
*H03M 13/00* (2006.01)

(52) U.S. Cl.
CPC ....... *H03M 13/116* (2013.01); *H03M 13/616* (2013.01)

(58) Field of Classification Search
CPC .................................................. H03M 13/116
USPC ........................................ 714/752, 755, 757
See application file for complete search history.

(56) References Cited

U.S. PATENT DOCUMENTS

| | | | |
|---|---|---|---|
| 7,519,895 B2 * | 4/2009 | Kyung | H03M 13/27 714/780 |
| 8,458,556 B2 | 6/2013 | Planjery et al. | |
| 8,510,624 B2 | 8/2013 | Kim et al. | |
| 9,331,716 B2 * | 5/2016 | Panteleev | H03M 13/1171 |
| 10,110,249 B2 | 10/2018 | Zhang et al. | |
| 10,530,392 B2 | 1/2020 | Reynwar et al. | |
| 2003/0126551 A1 | 7/2003 | Mantha et al. | |
| 2005/0149842 A1 | 6/2005 | Kyung et al. | |
| 2005/0229090 A1 | 10/2005 | Shen et al. | |
| 2006/0036926 A1 * | 2/2006 | Hocevar | H03M 13/118 714/758 |
| 2007/0283219 A1 | 12/2007 | Park et al. | |
| 2014/0223254 A1 * | 8/2014 | Pisek | H03M 13/033 714/755 |
| 2014/0229792 A1 | 8/2014 | Varnica et al. | |
| 2017/0244515 A1 | 8/2017 | Razzetti et al. | |

(Continued)

FOREIGN PATENT DOCUMENTS

EP 2 273 683 A2 1/2011

OTHER PUBLICATIONS

International Search Report and Written Opinion of the International Searching Authority, PCT Application No. PCT/US19/45001, dated Oct. 29, 2019, 10 pages.

(Continued)

*Primary Examiner* — Fritz Alphonse
(74) *Attorney, Agent, or Firm* — Fish & Richardson P.C.

(57) ABSTRACT

A method and apparatus for encoding low-density parity check codes uses parity check matrices composed of circulant blocks. The apparatus operates on a parity check matrix of a judiciously designed block structure, which permits low cost hardware implementation, and high encoding throughput.

25 Claims, 9 Drawing Sheets

(56) References Cited

U.S. PATENT DOCUMENTS

2018/0062666 A1    3/2018   Zhang et al.
2019/0044537 A1    2/2019   Reynwar et al.

OTHER PUBLICATIONS

Cai et al., "Low-Complexity Finite Alphabet Iterative Decoders for LDPC Codes," IEEE International Symposium on Circuits and Systems, May 2013, 1332-1335.

Cui et al., "Reduced-complexity column-layered decoding and implementation for LDPC codes," IET Commun, 2011, 5(15): 2177-2186.

Declercq et al., "An Imprecise Stopping Criterion Based on In-Between Layers Partial Syndromes,"IEEE Communications Letters, Jan. 2018, 22(1): 13-16.

Declercq et al., "Approaching Maximum Likelihood decoding of finite length LDPC codes via FAID diversity," IEEE Information Theory Workshop, 2012, 487-491.

Declercq et al., "Finite Alphabet Iterative Decoders—Part II: Towards Guaranteed Error Correction of LDPC Codes via Iterative Decoder Diversity," IEEE Transactions on Communications, Oct. 2013, 61(10): 4046-4057.

Hocevar, "A Reduced Complexity Decoder Architecture via Layered Decoding of LDPC Codes," IEEE SIPS, 2004, 107-112.

Nguyen-Ly et al., "Analysis and Design of Cost-Effective High-Throughput LDPC Decoders," IEEE Transactions on Very Large Scale Integration (VLSI) Systems, Mar. 2018, 26(3): 508-521.

Planjery et al., "Finite alphabet iterative decoders—Part I: Decoding Beyond Belief Propagation on the Binary Symmetric Channel," IEEE Transactions on Communications, Oct. 2013, 61(10): 4033-4045.

Planjery et al., "Finite alphabet iterative decoders LDPC codes surpassing floating-point iterative decoders," Electronic Letters, Aug. 2011, 47(16): 2 pages.

Radosavljevic et al., "Optimized Message Passing Schedules for LDPC Decoding," IEEE Signals, Systems and Computers, Oct. 2005, 591-595.

Sharon et al., "Efficient Serial Message-Passing Schedules for LDPC decoding," IEEE Transactions on Information Theory, Nov. 2007, 53(11): 4076-4091.

Vasic and Milenkovic, "Combinatorial Constructions of Low-Density Parity-Check Codes for Iterative Decoding," IEEE Transactions on Information Theory, Jun. 2004, 50(6): 1156-1176.

Zhang and Fossorier, "Transactions Letters: Shuffled Iterative Decoding," IEEE Transactions on Communications, Feb. 2005, 53(2): 209-213.

\* cited by examiner

METHOD AND APPARATUS FOR ENCODING QUASI-CYCLIC LOW-DENSITY PARITY CHECK CODES

CROSS-REFERENCE TO RELATED APPLICATIONS

This application claims the benefit of Provisional Application No. 62/714,607, filed Aug. 3, 2018, the entire contents of each of which are hereby incorporated by reference as if fully set forth herein.

FIELD OF INVENTION

The present invention generally relates to error correction coding for information transmission, storage and processing systems, such as wired and wireless communications systems such as optical communication systems, computer memories, mass data storage systems. More particularly, it relates to encoding method and apparatus for block codes such as low-density parity check (LDPC) codes, and more specifically to LDPC codes with block parity check matrices, called quasi-cyclic (QC) LDPC codes.

BACKGROUND OF THE INVENTION

Low-Density Parity Check (LDPC) Codes

Error correcting codes play a vital role in communication, computer, and storage systems by ensuring the integrity of data. The past decade has witnessed a surge in research in coding theory which resulted in the development of efficient coding schemes based on low-density parity check (LDPC) codes. Iterative message passing decoding algorithms together with suitably designed LDPC code ensembles have been shown to approach the information-theoretic channel capacity in the limit of infinite codeword length. LDPC codes are standardized in a number of applications such as wireless networks, satellite communications, deep-space communications, and power line communications.

For a (N, K) LDPC code with length N, dimension K, the parity check matrix (PCM) H of size $M \times N = (N-K) \times N$ (assuming that H is full rank), is composed of a small number of ones. We denote the degree of the j-th column, i.e. the number of ones in the j-th column, by $d_v(j)$, $1 \leq j \leq N$. Similarly, we denote the degree of the i-th row, i.e. the number of ones in the i-th row, by $d_c(i)$, $1 \leq i \leq M$. Further, we define the maximum degree for the rows and columns:

$$\gamma = \max_{1 \leq j \leq N} d_v(j) \qquad (1)$$

$$\rho = \max_{1 \leq i \leq M} d_c(i)$$

When the number of ones in the columns and the rows of H is constant, the LDPC code is called regular, otherwise the LDPC code is said irregular. For regular LDPC codes, we have $\gamma = d_v = d_v(j)$, $1 \leq j \leq N$, and $\rho = d_c = d_c(i)$, $1 \leq i \leq M$. The $(d_v, d_c)$-regular LDPC code ensemble represents a special interesting type of LDPC codes. For this type, the code rate is $R = K/N = 1 - d_v/d_c$ if the PCM H is full rank.

If a binary column vector of length N, denoted $x = [x_1, x_2, \ldots, x_N]^T$, is a codeword, then it satisfies $Hx = 0$, where the operations of multiplication and addition are performed in the binary field GF(2), and 0 is the length-M all-zero column vector. $x^T$ denotes the transposition of x, both for vectors and matrices. An element in a matrix can be denoted indifferently by $H_{m,n}$ or $H(m, n)$. Similarly, an element in a vector is denoted by $x_n$ or $x(n)$. The horizontal concatenation, respectively vertical concatenation, of vectors and matrices is denoted [A, B], respectively [A; B].

Quasi-Cyclic LDPC Codes The present invention particularity relates to the class of quasi-cyclic LDPC codes (QC-LDPC). In QC-LDPC codes, the PCM H is composed of square blocks or submatrices of size $L \times L$, as described in Equation (2), in which each block $H_{i,j}$ is either (i) a all-zero $L \times L$ block, or (ii) a circulant permutation matrices (CPM).

$$H = \begin{bmatrix} H_{1,1} & H_{1,2} & \ldots & H_{1,N_b} \\ H_{2,1} & H_{2,2} & \ldots & H_{2,N_b} \\ \vdots & \vdots & \vdots & \vdots \\ H_{M_b,1} & H_{M_b,2} & \ldots & H_{M_b,N_b} \end{bmatrix} \qquad (2)$$

A CPM is defined as the power of a primitive element of a cyclic group. The primitive element is defined, for example, by the $L \times L$ matrix, $\alpha$, shown in Equation (3) for the case of $L=8$. As a result, a CPM $\alpha^k$, with $k \in \{0, \ldots, L-1\}$ has the form of the identity matrix, shifted k positions to the left. Said otherwise, the row-index of the nonzero value of the first column of $\alpha^k$, is $k+1$. The value of k is referred to as the CPM value. The main feature of a CPM is that it has only a single nonzero element in each row/column and can be defined by its first row/column together with a process to generate the remaining rows/columns. The simplicity of this process translates to a low hardware resources needed for realizing physical connections between subsets of codeword bits and parity check equations in an LDPC encoder or decoder.

$$\alpha = \begin{bmatrix} 0 & 0 & 0 & 0 & 0 & 0 & 0 & 1 \\ 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \end{bmatrix} \qquad (3)$$

The PCM of a QC-LDPC code can be conveniently represented by a base matrix (or protograph matrix) B, with $M_b$ rows and $N_b$ columns which contains integer values, indicating the powers of the primitive element for each block $H_{i,j}$. Consequently, the dimensions of the base matrix are related to the dimensions of the PCM the following way: $M = M_b L$, $N = N_b L$, and $K = K_b L$ (assuming that H is full rank). An example of matrices H and B for $M_b \times N_b = 4 \times 5$ and $L=8$ is shown in Equation (4).

$$H = \begin{bmatrix} \alpha^7 & \alpha^1 & \alpha^4 & \alpha^3 & 0 \\ \alpha^2 & 0 & \alpha^3 & I & \alpha^4 \\ \alpha^4 & \alpha^6 & 0 & I & \alpha^2 \\ I & \alpha^2 & \alpha^7 & 0 & \alpha^5 \end{bmatrix} \qquad (4)$$

$$B = \begin{bmatrix} 7 & 1 & 4 & 3 & -\infty \\ 2 & -\infty & 3 & 0 & 4 \\ 4 & 6 & -\infty & 0 & 2 \\ 0 & 2 & 7 & -\infty & 5 \end{bmatrix}$$

where $I=\alpha^0$ is the identity matrix, and by convention $\alpha^{-\infty}=0$ is the all-zero L×L matrix.

General Circulant Matrices

In this invention, the blocks $H_{i,j}$ are square L×L matrices, which are either a CPM or a all-zero block. However, the process of encoding a codeword x cannot be made from the PCM, but from a generator matrix G, as explained in paragraph 006. There are rare exceptions where the encoding can be performed directly with H, like in the case of low density generator matrices (LDGM) codes, but we do not discuss those cases in this disclosure.

General circulant matrices, not restricted to single CPMs, can appear during the process of computing G from H. A circulant matrix C is defined by the sum of w CPM with distinct powers:

$$C = \sum_{k=1}^{w} \alpha^{i_k} \tag{5}$$

where $i_k \neq i_{k'}$, $0 \leq i_k \leq L-1$ and $0 \leq i_{k'} \leq L-1$, $\forall(k, k')$. In this definition, w is called the weight of circulant C, and we have $0 \leq w \leq L$. Special cases of circulants are: (i) when w=0, the circulant is the all-zero block, (ii) when w=1, the circulant is a CPM.

Encoding

This invention pertains to LDPC codes and their encoders and is applicable to any QC-LDPC code class, regular or irregular.

A codeword of an LDPC code, $x=[x_1, x_2, \ldots, x_N]^T$, is created from a vector of information bits $u=[u_1, u_2, \ldots, u_K]^T$, following the equation x=G u, where G is a generator matrix of the code. Without loss of generality, we assume that G is put in a systematic form, and that the codeword is organized as $$x = \begin{bmatrix} u \\ r \end{bmatrix} \tag{6}$$

where $r=[r_1, r_2, \ldots, r_M]^T$ is the vector of redundancy bits.

In general, a generator matrix G can be obtained from a parity check matrix H by computing the reduced row echelon form of H, by means of Gaussian Elimination (GE). Since H is composed of circulants, and it is known that the inverse of a circulant matrix is also a circulant matrix, it follows that G is also composed of circulants, although not necessarily reduced to CPMs. The encoding equation becomes:

$$x = \begin{bmatrix} u \\ r \end{bmatrix} = Gu \Rightarrow x = \begin{bmatrix} u \\ r \end{bmatrix} = \begin{bmatrix} I \\ P \end{bmatrix} u \tag{7}$$

where P is a dense matrix composed of general circulants.

For QC-LDPC codes, the GE process can be performed at the circulant level, making use only of operations on circulant matrices (multiplications, additions, inverse). This also means that the leading coefficients used to pivot the matrix during GE are themselves circulant matrices. Two operations can increase the weights of the circulants:

When the leading coefficient is found, one needs to compute its inverse to create an identity block at the pivoting location on the main diagonal. If the leading coefficient is not a CPM, its inverse is usually a large weight circulant, After the leading coefficient is turned into the identity, the corresponding block-row is combined with the other remaining block-rows in order to build the block-row echelon form. This combination of block-rows creates also large weight circulants.

An alternative of using a direct inverse of matrix H is to transform it into an upper triangular matrix, using a greedy Sparse Gaussian Elimination. In GE, one can stop the process when the block-row echelon form has been found, that is when the resulting matrix is in upper triangular form. For a matrix which contains all-zeros blocks and a small number of CPM, the Gaussian Elimination algorithm can be constrainted such that the resulting upper triangular matrix is the sparsest possible. Indeed, if the reduced block-row echelon form is unique and corresponds to the inverse of the original matrix, its block-row echelon form is not unique and depends on the sequence of leading coefficients that are used to perform the Gaussian Elimination. In other words, depending on the sequence of leading coefficients, one can get different encoding matrices with different sparseness. The encoding equation become $$Hx = 0 \Rightarrow [H_1 \quad H_2] \begin{bmatrix} u \\ r \end{bmatrix} = 0 \Rightarrow H_1 u + H_2 r = 0 \tag{8}$$

where $H_1$ is a dense matrix of size $M_b \times K_b$ composed of general circulants, and $H_2$ is an upper triangular matrix (at the block level), of size $M_b \times M_b$, also composed of general circulants. The encoder proceeds in two steps: (i) the first step consists in computing the parity check values of the first part of Equation (8), $c=H_1 u$, (ii) the second step recursively computes the values of the redundancy bits r using backward propagation, since the matrix $H_2$ is upper triangular.

To summarize, matrices P or ($H_1$, $H_2$) are used to perform the encoding, depending on the chosen encoding procedure. Those matrices are usually composed of general circulant blocks with large weights, typically of the order of L/2, where L is the circulant size. From the hardware complexity standpoint, it is advantageous to design design QC-LDPC codes for which the corresponding encoding matrix is as sparse as possible:

1. first, the number of operations involved in (7) and (8) grows linearly with the density of matrices P and ($H_1$, $H_2$). If those matrices have large weights, hardware implementations of (7) or (8) would suffer from either a large complexity, or a limited throughput. Having circulant blocks with large weights in the encoding matrices is not compliant with our objective of having an encoder with low complexity and high throughput.

2. matrices P and ($H_1$, $H_2$) may contain a combination of circulant blocks with large weight, and others with low weights (even some CPM). However, the circuits that implement sparse circulant multiplication or dense circulant multiplication are different. As a result, an encoder using (7) or (8) would need a special circuit for the sparse multiplication, and a another circuit for dense multiplication, which is not optimal in terms of hardware re-use and lead to unnecessary large complexity.

It is therefore highly beneficial to consider an encoding procedure where the encoding matrices are sparse, composed of circulant blocks with low weights. The sparseness of the encoding matrix is not ensured by the classical encoding methods. We propose in this invention a method to use a very sparse representation of the encoding matrix, in order to obtain an encoding architecture which has both low complexity and high throughput.

Layers and Generalized Layers of QC-LDPC Codes

For a base matrix B of size ($M_b$, $N_b$), the rows (or block-rows of H) are referred to as horizontal layers (or row layers). The concept of layer has been introduced originally for the case of regular array based QC-LDPC codes, where the base matrix is full of CPMs, and contains no $\alpha^{-\infty}$, i.e., no all-zero L×L block.

The concept of layers in a base matrix can be further extended to the concept of generalized layer (GL). The definition follows:

A generalized layer is defined as the concatenation of two or more layers of the base matrix, such that in each block-column of the generalized layer there is at most one CPM while its other elements are all-zero blocks.

A full generalized layer has further the property that each block-column contains exactly one CPM.

This definition ensures that for a QC-LDPC code with maximum column degree γ, the PCM can be organized with at least γ GLs. For simplicity, we will assume that the number of GLs is always equal to the maximum column degree γ.

FIG. 1 shows an example of a PCM organized in γ=4 full GLs, indicated by 101, 102, 103 and 104. In this example, each of the GL contains 4 simple layers, for a total of $M_b$=16 block-rows in the base matrix. In general, each GL may contain a different number of block-rows, as long as the GL constraint in above definition is satisfied. In this example, the first GL 101 indicated in grey is composed of the first four block-rows of the base matrix.

In a PCM with a generalized layers structure, the block-rows of each generalized layer may be organized in an arbitrary order, and do not necessarily contain consecutive block-rows. In FIG. 2, we show an example of the matrix of FIG. 1, for which the block-rows of each GL have been regularly interleaved. Although the block-rows of the GL are not consecutive, this organization of a PCM still has the property that each GL contains a maximum of one non-zero block per column of the GL. For example the block rows 201, shown in grey, indicates the block-rows which compose $GL_1$, which are deduced from $GL_1$ in FIG. 1 by block-row interleaving.

The purpose of the GL organization of the PCM is to be able to perform processing of at least γ PCM blocks in parallel, without data access conflicts. This allows a larger degree of parallelism in the encoder/decoder algorithms, and leads to higher processing throughputs. Although the concept of layers and generalized layers for QC-LDPC codes has been introduced in the literature to improve the efficiency of the LDPC decoders, we show in this disclosure that such structure can also be beneficial for the QC-LDPC encoder.

QC-LDPC with Minimum Row-Gap Between Circulants

The organization of H in generalized layers is proposed to improve the throughput of the encoder. However, in order to reach very high throughputs, the PCM needs to have other constraints, with respect to the location of the CPM in each block-row. This constraint, that will be used in the description of this invention, is called gap constraint, and reflects the number of all-zero blocks that are between two consecutive CPM in the same block-row of H. On FIG. 1, we show an example of two consecutive circulants in the first block-row of H which are separated by three all-zero blocks. The gap between these two circulants is gap=4 blocks.

Let $b_i$ be the vector which stores the positions of nonzero blocks in the i-th row of the base matrix B. The vector $b_i$ is a length $d_c(i)$ vector, such that $B_{i,b_{i,k}}$ is a CPM and $B_{i,j}$ with $j \neq b_{i,k}$ is a all-zero block. Let us further denote the gap profile of row i by the vector $gap_i$ such that $$gap_{i,k} = b_{i,k+1} - b_{i,k} \quad 1 \leq k \leq d_c(i) - 1 \tag{9}$$

For example, for the matrix in (4), we have $b_3$=(1, 2, 4, 5), and $gap_3$=(1, 2, 1).

For the whole QC-LDPC matrix, the minimum gap is defined as:

$$gap^* = \min_{1 \leq i \leq M_b} \left\{ \min_{1 \leq k \leq d_c(i)-1} \{gap_{i,k}\} \right\} \tag{10}$$

Obviously, any QC-LDPC code has minimum gap*=1. As explained later in this disclosure, using QC-LDPC codes with a constraint on the minimum gap*>1 allows to derive encoders with larger throughputs. The gap constraint gap*>1 can be enforced by direct design of the PCM or the BM of the QC-LDPC code, or by re-arrangement of the columns.

SUMMARY OF THE INVENTION

The present invention relates to encoding of LDPC codes. In particular it relates to encoding of LDPC codes whose parity check matrices are organized in blocks. More specifically it relates to block matrices that are circulant permutation matrices, in which case the code is called quasi-cyclic (QC) QC-LDPC codes.

The present invention relates to a method and hardware apparatus to implement LDPC encoders in order to achieve both high encoding throughput as well low hardware resource usage. This is achieved by imposing various constraints on the structure of the parity check matrix and taylorimg the hardware processing units to efficiently utilize these specific structural properties, in the process of computing the redundancy bits from the information bits, and combining them into a codeword.

The method of the present invention is directed in utilizing the organization of the parity check matrices of QC-LDPC codes into block-rows and block-columns. The block-rows of the parity check matrix are referred to as layers.

The method of the present invention can be used to implement encoding algorithms and devise hardware architectures for QC-LDPC codes. In the class of codes whose parity check matrices also contain all-zero blocks, codes with regular or irregular distribution of all-zero blocks and non-zero blocks inside the parity check matrix can be encoded using the present invention.

Additionally, in some embodiments, the method of the present invention imposes the constraints with respect to the relative locations of the non-zero blocks in each block-row. More specifically, the constraints relate to the minimal number of all-zero blocks that must separate any two consecutive non-zero blocks in any given block-row. This separation is referred to as the gap constraint. The advantage of said gap constraint is in improving processing throughput.

Additionally, in some embodiments, the method of the present invention organizes the parity check matrix into generalized layers, composed of the concatenation of several block-rows. Each generalized layer of the parity check matrix contains at most one non-zero block in each block-column. The advantage of generalized layers is that they allow parallelization of processing of the blocks of the parity check matrix without data access conflicts, which in turn increases the encoding throughput.

In some embodiments, each generalized layer contains the same number of block-rows, and in preferred embodiments, the parity check matrix has as many generalized layers as the maximum block-column degree. The block rows that compose the generalized layers can be chosen in an arbitrary way: consecutive, interleaved or irregular.

The method of the present invention achieves high throughput and low hardware usage by imposing an additional specific structure, called the three-region structure, to the parity check matrix, and utilizing a method for computing redundancy bits from information bits adapted to this specific structure.

The three-region structure of the parity check matrix described in this invention is a decomposition of said matrix into three regions, ($R_1$, $R_2$, $R_3$), wherein each region is processed by a specific method and a specific apparatus, while the apparata for processing different regions share a common hardware architecture. The present invention relates to a method and hardware apparatus to implement said three-region processing.

Various features of the present invention are directed to reducing the processing complexity with an hardware-efficient encoder apparatus by utilizing the three-region structure of the QC-LDPC code, In addition, it utilizes the gap constraint as well as composition, structure and position of generalized layers. From an implementation standpoint, the three-region encoding method of the present invention has the advantage of reducing the amount of resource required to implement the encoder.

In the present invention, the $N_b$ block-columns of the parity check matrix are partitioned into three regions $R_1$, $R_2$ and $R_3$, defined by sub-matrices with $N_u$, $N_t$ and $N_s$ block-columns, respectively. In the present invention, the sub-matrix in the region $R_2$ is block-upper triangular, and the sub-matrix in the region $R_3$ contains an invertible $N_s \times N_s$ block matrix S concatenated on the top of a $(M_b - N_s) \times N_s$ all-zero block-matrix. In some embodiments, additional structures are imposed on the three regions. In some embodiments, the sub-matrix in the region $R_1$ is organized into said generalized layers, and has a minimum gap constraint of at least 2 in all its blocks-rows. In some embodiments, the sub-matrix in the region $R_2$ is also organized into generalized layers, and has a minimum gap constraint of at least 2 for all the non-zero blocks of its diagonal.

In accordance with one embodiment of the present invention, the computation of redundancy bits involves computation of parity check bits, wherein blocks of information bits are processed in parallel, producing $M_b$ blocks of parity check bits. These $M_b$ blocks of parity check bits are initialized by multiplying information vector with the sub-matrix in region $R_1$, and then processed using the sub-matrix of region $R_2$. The upper triangular structure of the sub-matrix in the region $R_2$ facilitates a recursive computation of the parity check bits in region $R_2$. Once the processing for regions $R_1$ and $R_2$ is finished, a small portion of $N_s$ blocks of parity check bits are used to compute the last set of redundancy bits. One feature of the present invention is that the size $N_s$ of the invertible matrix S in region $R_3$ is much smaller than the number of block-rows, which further reduces the computational resources needed to multiply its inverse $S^{-1}$ with the $N_s$ blocks of parity check bits, which computes the remaining set of $N_s$ blocks of redundancy bits.

Additional features of the present invention are directed to reducing the hardware resource and delay of the storage and processing of the inverse $S^{-1}$. While all the submatrices in all regions are sparse, including the matrix S, the method of present invention ensures that the inverse matrix $A = S^{-1}$ is also sparse. This feature additionally reduces storage requirements of hardware for processing of the matrix A.

Since the matrix S contains blocks of circulant permutation matrices and all-zero blocks, its inverse A is composed of circulant matrices and all-zero blocks, but the weight of circulant matrices in A may in general be large, usually of the order of half the circulant size. The method of the present invention is directed to using the matrices that have low-weight inverses, very much smaller than the circulant size.

One embodiment of the present invention capitalizes on the fact that the maximum circulant weight in the j-th block-column of A is no larger than $w_{max,j}$. This allows to process sequentially the j-th block-column of A, performing only multiplications with circulant permutation matrices.

One feature of the present invention is that the encoding method can be implemented in hardware using a single architecture of the circuit, for the three regions $R_1$, $R_2$ and $R_3$. This implementation allows a maximum hardware re-use, and therefore minimizes the amount of resource needed to build the encoding circuit. In each region, the inputs, outputs, and control instructions of the hardware model are though different.

It will be seen in the detailed disclosure that the objects set forth above are efficiently attained and, because some changes may be made in carrying out the proposed method without departing from the spirit and scope of the invention, it is intended that all matter contained in the description and shown in the accompanying drawings shall be interpreted as illustrative and not in a limiting sense.

BRIEF DESCRIPTION OF THE DRAWINGS

For a more complete understanding of the invention, reference is made to the following description and accompanying drawings, in which.

DETAILED DESCRIPTION OF THE INVENTION

Sparse Structure of the Parity Check Matrix H

In the present invention, the parity check matrix of an QC-LDPC code will be organized with the following form $$H = \left[ U_{M_u \times N_u} | T_{M_t \times N_t} | \begin{matrix} S_{N_s \times N_s} \\ 0_{(M_b-N_s) \times N_s} \end{matrix} \right] \quad (11)$$

where $0_{(M_b-N_s) \times N_s}$ is an all-zero matrix.

Similarly to the PCM H, the matrices (U, T, S) are composed of circulant blocks, and for ease of presentation, the dimensions of the submatrices are indicated in number of circulant blocks. This means that, following the notations of paragraph 0004, $$M_b = M_u = M_t = (N_t + N_s) \quad (12)$$

$$N_b = (N_u + N_t + N_s) \quad (13)$$

$$K_b = N_u \quad (14)$$

The PCM is organized into three regions:

Region $R_1$: composed of the matrix $U_{M_u \times N_u}$, which is a block matrix composed of a subset of the block columns of H, Region $R_2$: composed of the matrix $T_{M_t \times N_t}$, which is block upper-triangular, i.e. $T_{(M_t-N_t)+i,j}=0 \ \forall j > N_t-i, \ 0 \leq i \leq N_t-1$, Region $R_3$: composed of the matrix $S_{N_s \times N_s}$ and an all-zero $(M_b-N_s) \times N_s$ block-matrix. The matrix S is a square block matrix and is assumed to be full rank and invertible.

Figure 1:
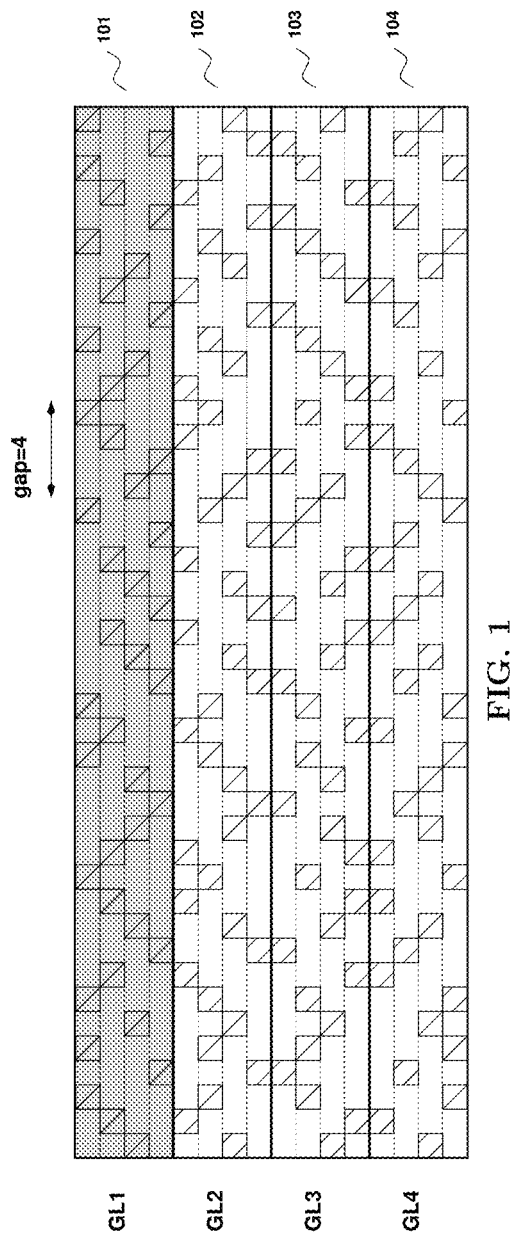
FIG. 1 shows the organization of PCM H in $d_v = 4$ Generalized Layers.
Figure 2:
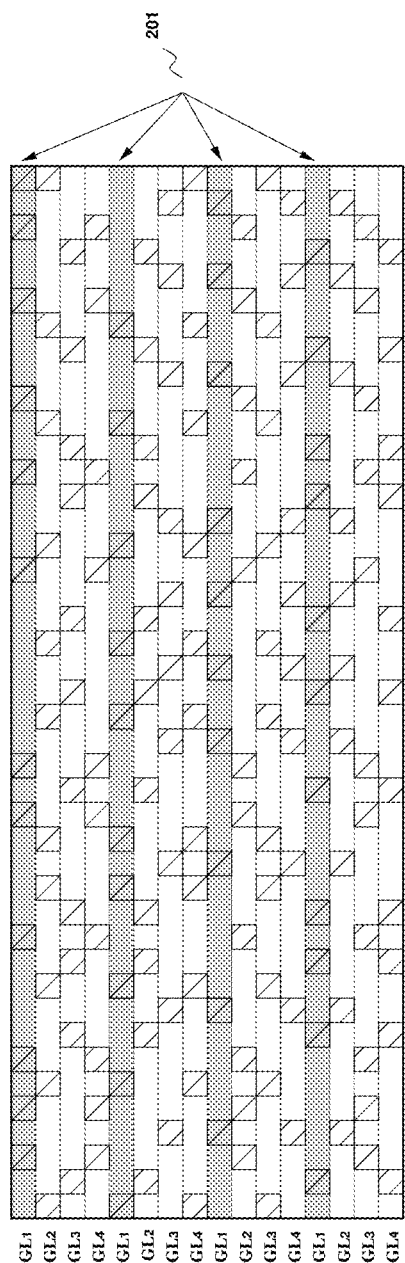
FIG. 2 shows the organization of PCM H in Generalized Layers with interleaved rows.
Figure 3:
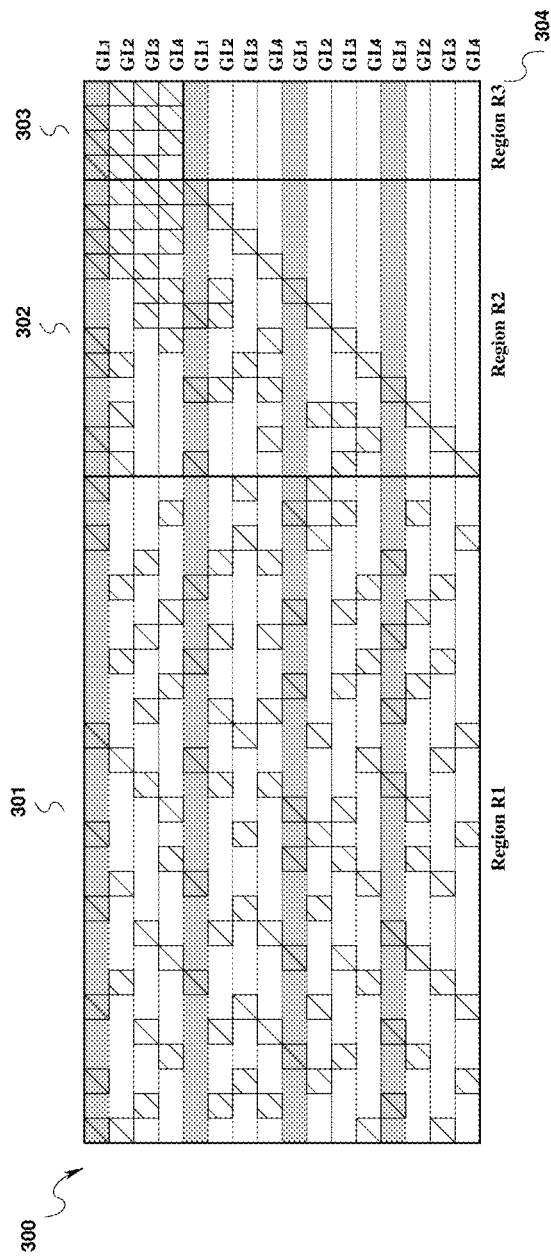
FIG. 3 illustrates the structure of the disclosed parity check matrix.

An example of PCM with such structure is shown in FIG. 3. The matrix H is shown on 300, with its decomposition in submatrices: the block matrix U 301, the upper-triangular matrix T 302, the square matrix S 303, and finally the all-zero matrix $0_{(M_b-N_s) \times N_s}$ matrix 304.

The present invention comprises also PCM deduced from the structure shown in (11) by any block-row and/or block-column permutation.

Organization of the PCM in Generalized Layers, with Minimum Gap

In a preferred embodiment of this invention, the PCM H is organized in generalized layers, which in turn imposes the constraint that the submatrices (U, T, S) are also organized in generalized layers.

For illustration purposes, we follow the organization of the interleaved generalized layers presented in paragraph 0007, other arrangements may be possible, and any other organization of the block-rows in GLs obtained through permutations of block-rows is also covered with this invention. As a non-limiting illustrative example, the structure of a PCM organized in GLs is shown in FIG. 3 in the case of $\gamma=4$ GLs, each one composed of exactly $M_b/\gamma=4$ block-rows. In general, the number of block-rows in each GL can be different.

In the example of figure FIG. 3, the k-th generalized layer $GL_k$ is composed of the following $M_b/\gamma$ block-rows:

$$[H_{\gamma i+k,1}, H_{\gamma i+k,2}, \ldots, H_{\gamma i+k,N_b}] \quad 0 \leq i < M_b/\gamma \quad (15)$$

The same block-row indices in matrices (U, T, S) compose the generalized layer $GL_k$ for the corresponding submatrices.

In preferred embodiments of this invention, the matrices U and T further have gap constraints on their block-rows to help improving the throughput of the encoder. For the matrix U, we assume that each and every block-row has a minimum gap$\geq 2$. For the matrix T, we assume that, in each and every block-row, the gap between the diagonal block and the previous block is at least gap$\geq 3$. In the example of FIG. 3, the minimum gap for the diagonal blocks of T is gap=3, reached for the row-blocks j=6, j=8, j=11, j=12 and j=16. We do not assume any gap constraint for the non-diagonal blocks of T.

The combination of the GL organization and the gap constraints allows to derive a high-throughput architecture for region $R_1$ and region $R_2$ encoding.

Codeword Structure

The codeword x can be written as $$x = \begin{bmatrix} x_1 \\ x_2 \\ \vdots \\ x_{N_b} \end{bmatrix} \quad (16)$$

where $x_j$, $1 \leq j \leq N_b$ is a binary column vector of length L. Now the equation H x=0 can be written as $$H_{1,1}x_1 + H_{1,2}x_2 + \ldots + H_{1,N_b}x_{N_b} = 0 \quad (17)$$
$$H_{2,1}x_1 + H_{2,2}x_2 + \ldots + H_{2,N_b}x_{N_b} = 0$$
$$\vdots$$
$$H_{M_b,1}x_1 + H_{M_b,2}x_2 + \ldots + H_{M_b,N_b}x_{N_b} = 0$$

All the operations in this disclosure are described as block computation in GF(2), that is using only L×L circulant blocks, e.g. $H_{i,j}$ and binary vectors of length L, e.g. $x_j$. In particular, the multiplication of $x_j$ by a CPM is equivalent to a simple circular shift of the binary values in $x_j$. With the definitions in 0004, the PCM and the exponents in the base matrix B are related as $$H_{i,j} = \alpha^{B_{i,j}}.$$

We have:

$$H_{i,j}x_j = x_j \text{ if } B_{i,j} = 0 \quad (18)$$

$$H_{i,j}x_j = [x_{B_{i,j}+1}, x_{B_{i,j}+2}, \ldots, x_L, x_1, \ldots, x_{B_{i,j}}]^T \text{ if } B_{i,j} \geq 1 \quad (19)$$

The hardware implementation of operation (18) is usually done using Barrel Shifters, such that $H_{i,j} x_j$ is the barrel-shifted version of $x_j$.

In the present invention, the codewords are further organized following the structure of the PCM described in paragraph 0036. We re-write Equation (16) as $$x = \begin{bmatrix} u \\ t \\ s \end{bmatrix} \quad (20)$$

where u is the vector of information bits, $$\begin{bmatrix} t \\ s \end{bmatrix}$$

is the vector of redundancy bits, and $$u = \begin{bmatrix} u_1 \\ u_2 \\ \vdots \\ u_{N_u} \end{bmatrix} \quad (21)$$

$$t = \begin{bmatrix} t_1 \\ t_2 \\ \vdots \\ t_{N_t} \end{bmatrix}$$

$$s = \begin{bmatrix} s_1 \\ s_2 \\ \vdots \\ s_{N_s} \end{bmatrix}$$

The binary column vectors $u_j$, $t_j$, and $s_j$ are of length L, and for clarity, $N_u = K_b$ is the length of the information vector (the number of length-L sub-vectors in u), and $N_t + N_s = M_b$ is the length of the redundancy vector.

Parity Checks Vector Structure

The encoding process involves computation of the vector of parity checks, denoted by c:

$$c = \begin{bmatrix} c_1 \\ c_2 \\ \vdots \\ c_{M_b} \end{bmatrix} \quad (22)$$

Similar to the structure of the codeword vector, the vector of parity checks is also defined at the block level, i.e. $c_i$ is a vector of L binary values. The parity checks are used to compute the vector of redundancy bits, and at the end of the encoding process, we must have H x=c=0.

Let us further define the vector of temporary parity checks, denoted $c^{(j)}$, $1 \leq j \leq N_b$, which contain the values of the parity checks using only the first j columns of H:

$$\begin{bmatrix} c_1^{(j)} \\ c_2^{(j)} \\ \vdots \\ c_{M_b}^{(j)} \end{bmatrix} = \begin{bmatrix} H_{1,1} & H_{1,2} & \ldots & H_{1,j} \\ H_{2,1} & H_{2,2} & \ldots & H_{2,j} \\ \vdots & \vdots & \vdots & \vdots \\ H_{M_b,1} & H_{M_b,2} & \ldots & H_{M_b,j} \end{bmatrix} \begin{bmatrix} x_1 \\ x_2 \\ \vdots \\ x_j \end{bmatrix} \quad (23)$$

The vector of temporary parity checks will be useful for explaining the three sequential steps of the encoding process. Note that from the definition of the PCM, the final temporary parity checks vector is equal to the all zero vector, $c^{(N_b)} = c = 0$.

Parity Checks Vector Structure with Generalized Layers

In a preferred embodiment of this invention, the PCM is organized in γGLs. This means that the vector of temporary parity checks can be partitioned in γ parts, each and every part corresponding to one GL. As an illustrative example, the vector of temporary parity checks $c^{(j)}$ corresponding to the PCM of figure FIG. 3 can be partitioned into γ=4 parts:

$$GL_1 : [c_1^{(j)}; c_5^{(j)}; c_9^{(j)}; c_{13}^{(j)}] \quad (24)$$
$$GL_2 : [c_2^{(j)}; c_6^{(j)}; c_{10}^{(j)}; c_{14}^{(j)}]$$
$$GL_3 : [c_3^{(j)}; c_7^{(j)}; c_{11}^{(j)}; c_{15}^{(j)}]$$
$$GL_4 : [c_4^{(j)}; c_8^{(j)}; c_{12}^{(j)}; c_{16}^{(j)}]$$

because according to FIG. 3, the $GL_1$ consists of block-rows 1, 5, 9 and 13, $GL_2$ consists of block-rows 2, 6, 10 and 14, etc.

In this preferred embodiment, each part of the temporary parity checks vector can be stored in a separate memory, and computed using Equation (23) using a separate circuit.

Encoding Using Structure of H

In this paragraph, we describe the global encoding process that composes the main purpose of this invention, and we will describe in details each step in the next paragraphs.

According to Equation (11), the PCM is composed of three regions ($R_1$, $R_2$, $R_3$), which results in the decomposition of the encoding process into three steps, as explained below.

With the notations of paragraphs 0036 and 0038, Equation (17) can be now written as $$Uu + Tt + \begin{bmatrix} S \\ 0 \end{bmatrix} s = 0. \quad (25)$$

The $K_b$ blocks $u_1, u_2, \ldots, u_{K_b}$ contain the information bits and can be chosen freely. The vectors t and s contain the redundancy bits, and they must be calculated from (25).

The three sequential steps of the encoding process are defined as follows:

Step 1: The first step computes the temporary parity checks vector $c^{(K_b)}$ using only region $R_1$, i.e. $c^{(K_b)} = U$ u.

Step 2: The second step computes the first sub-vector of redundancy bits t using only region $R_2$, with the values of $c^{(K_b)}$ as input. Another output of the second step is a new vector of temporary parity checks $c^{(K_b+N_t)}$, equal to $c^{(K_b+N_t)} = U$ u+T t.

Step 3: The third step computes the second sub-vector of redundancy bits s using only region $R_3$, with the values of $c^{(K_b+N_t)}$ as input.

After the completion of the above three steps, the vector of redundancy bits [t; s] is assembled from the sub-vectors t and s and the encoded codeword x=[u; t; s] is obtained.

Reusable Hardware for Encoding of Regions $R_1$, $R_2$ and $R_3$

As mentioned in paragraph 0041, the encoder is decomposed into three steps, each one based on a different structure of the corresponding sub-matrix of H. For the efficient hardware realization of the encoder, it is desirable to design an architecture which uses the same hardware units for all regions, since it allows to re-use the same circuit for the sequential processing of the three steps.

This invention proposes a single architecture for all three regions of the encoder, which is described in this paragraph. This single architecture is specifically oriented toward the preferred embodiment of the invention described in paragraph 0037, i.e. when the PCM is organized in γGLs, and the minimum gap of matrix U is gap*≥2.

Figure 4:
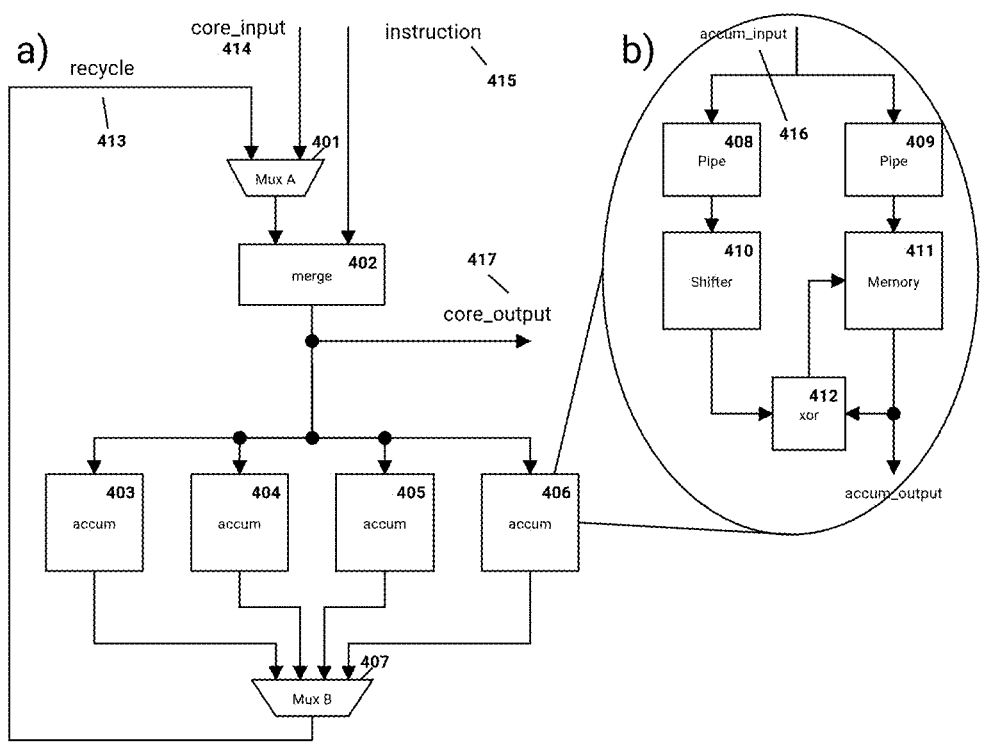
FIG. 4 describes the top level common hardware for implementing the encoder, with two parts: a) Core encoding hardware, and b) Accumulator hardware.

FIG. 4 shows the schematic of the core of the encoder (indicated with a)), together with the details of the accumulator implementation, (indicated with b)). The particular example is shown for the case of γ=4. This same hardware model will be used for all three regions. The core of the encoder is composed of multiplexers 401 and 407, merging logic 402, and γ accumulators (403, 404, 405, 406). It also contains a recycle stream 413 which is included to render the hardware general enough to be used for all three regions. The details about how the recycle stream differ in each region are given in later paragraphs.

The core input 414 is composed of data, whose nature depends on the region being processed. In region $R_1$, the inputs to the core are the information bits u. In region $R_2$ and $R_3$, the input to the core is not used. The multiplexer block 401 is in charge of selecting the correct data to be sent to the merger block 402, which could be either new input data for region $R_1$ processing, or the data from the recycle stream 413 for region $R_2$ and $R_3$ processing.

The merger block 402 processes the instructions received from the instruction stream 415 and associates them with data coming from 401. The merger block contains a set of registers to store the data, in case they need to be used by several instructions. An instruction may also indicate that the merger block should pause for several clock cycles without consuming more instructions.

Each accumulator is in charge of a different GL, i.e. stores and updates its part of the data, and therefore contains a memory which stores L $M_b/\gamma$ bits, where $M_b/\gamma$ is the number of block-rows in a GL. The processed data is not the same in all regions: in regions $R_1$ and $R_2$, the data stored in the accumulator are temporary parity check bits $c^{(j)}$, while in region $R_3$, the data are redundancy bits s. Thanks to the organization of the PCM in GLs, one and only one block of data (L bits) is accessed in parallel in each accumulator, and so memory 411 has a width of L and a depth of $M_b/\gamma$. We refer to the contents of address a in memory k as $mem_{k,a}$, 1≤k≤γ. The inputs/outputs to an accumulator are then the following:

$d_{in}$: L bits of data, indicated by 416,
b: the CPM value, telling the barrel shifter how much to shift the data by,
a: the address in the memory of the data that will be read and updated,
en: signal to enable the writing of the updated data to the memory,
$d_{out}$: L bits of data, output from accumulator.

The information $d_{in}$ and b go to the barrel shifter 410 which produces $d_{bs}=\alpha^b d_{in}$, where $\alpha^b$ is the CPM being processed. According to the definition of the base matrix B (4), the shift value b is equal to the exponent $b_{j,i}$ for the i-th column and the j-th row of the PCM. The address a is read from the memory 411 to get $mem_{k,a}$ which is then XOR-ed with the barrel shifted data to obtain the accumulated binary values $d_{out}=mem_{k,a}+d_{bs}$. The computed data $d_{out}$ is written back to the same address in the memory and serves as output to the unit. The pipes 408 and 409 may or may not be necessary to keep the pipeline lengths matching for different paths.

The instructions 415 received by the core control how the data are processed. An example of the instruction structure is given with the following items:

addresses: the γ addresses of the data sent to the accumulators,
shifts: the γ CPM values for the barrel shifters, sent to the accumulators,
updates: the γ enable signals for writing in the accumulator memories,
output: a bit that indicates whether the data should be output on stream 417,
recycle: a bit that indicates whether the accumulator outputs should be recycled,
selected: address for Mux B 408,
consume: whether the merging block 402 should take data from Mux A 401 or continue to use existing data,
pause: used by the merging block 402 to know when to pause for a given number of clock cycles.

Encoding of Region $R_1$

The encoding step corresponding to region $R_1$ consists of the computation of the temporary parity checks $c^{(K_b)}$ using the formula $c^{(K_b)}=U\,u$:

$$\begin{bmatrix} c_1^{(K_b)} \\ c_2^{(K_b)} \\ \vdots \\ c_{M_b}^{(K_b)} \end{bmatrix} = \begin{bmatrix} U_{1,1} & U_{1,2} & \ldots & U_{1,K_b} \\ U_{2,1} & U_{2,2} & \ldots & U_{2,K_b} \\ \vdots & \vdots & \vdots & \vdots \\ U_{M_b,1} & U_{M_b,2} & \ldots & U_{M_b,K_b} \end{bmatrix} \begin{bmatrix} u_1 \\ u_2 \\ \vdots \\ \vdots \\ u_{K_b} \end{bmatrix} \quad (26)$$

This computation can be done sequentially, column by column, from column j=1 to column j=$K_b$ of U. Since H is sparse, U is sparse as well, and the j-th column of U is composed of $d_v(j)$ non-zero blocks. Let $(i_1, \ldots, i_{d_v(j)})$ be the block indices of the non-zero blocks, with $1 \le i_k \le M_b$. For ease of presentation, the column index is dropped from these notations. The process of encoding for region $R_1$ is described in Algorithm 1.

---
Algorithm 1: Encoding of region $R_1$

Input: vector of information bits u, region $R_1$ of the PCM U
Output: vector of temporary parity checks $c^{(K_b)}$
Step-a: initialize $c^{(0)} = 0$
for j = 1 to $K_b$ do
   Step-b: compute the block indices of the non-zero blocks,
   $(i_1, \ldots, i_{d_v(j)})$,
   Step-c: compute the updated parity check values,
   for k = 1 to $d_v(j)$ do
      $c_{i_k}^{(j)} = c_{i_k}^{(j-1)} + U_{i_k,j} u_j$
   end
end

---

The values of the temporary parity checks along the encoding process do not need to be stored, as only the last values $c^{(K_b)}$ are needed for the next step. The temporary parity check values can be efficiently stored into a single vector, initialized to 0 and updated sequentially using Algorithm 1.

In a preferred embodiment of the invention, the PCM is organized in γ interleaved generalized layers, such that the $d_v(j)$ non-zero blocks in each and every column of U belong to a different generalized layer. A simple example of the preferred embodiment is when the QC-LDPC code is strictly regular, with $d_v(j)=d_v=\gamma$. In this case, the matrix U is formed with $d_v$ generalized layers, each of one containing exactly one non-zero block per column. Under this preferred embodiment, the $d_v(j)$ computations of Step-c in Algorithm 1 can be performed in parallel, using a multiplicity of $d_v(j)$ circuits, without any memory access violation. Further details about the hardware realization of this step are described in the next paragraph.

Hardware Realization of Encoding of Region $R_1$

Figure 5:
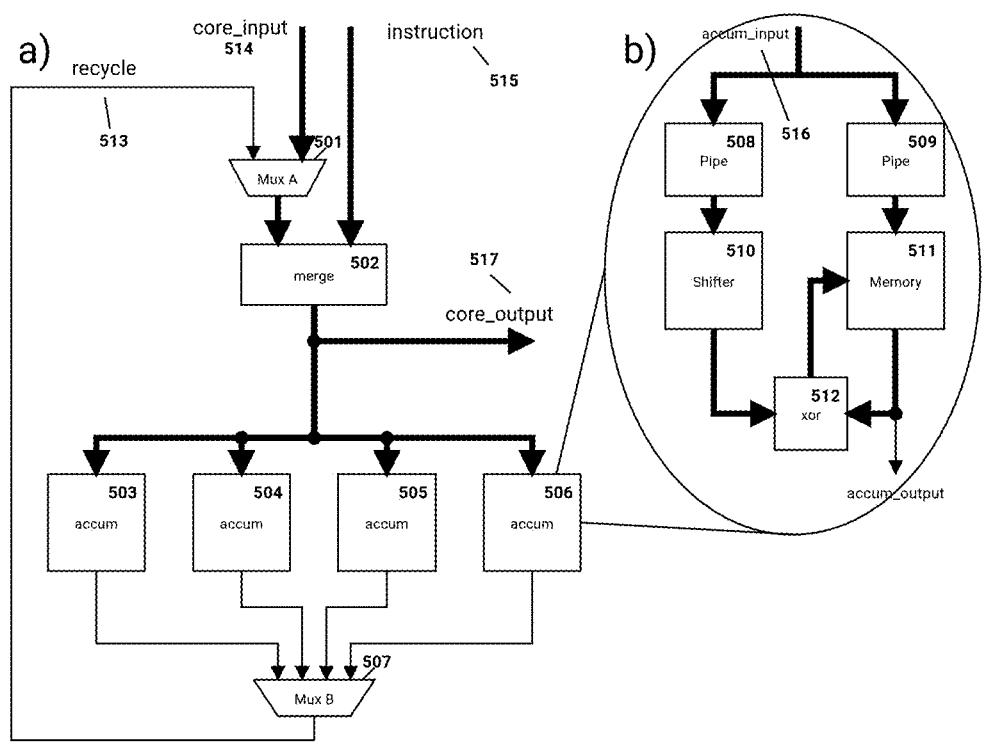
FIG. 5 describes the encoding hardware in Region $R_1$, with two parts: a) Core encoding hardware, and b) Accumulator hardware.

FIG. 5 shows the schematic of a) the core of the encoder, and b) the details of the accumulator implementation. The thick arrows indicate the flow of data and instructions during the processing of region $R_1$.

In this region, the data which are processed by the accumulators (503, 504, 505, 506) are temporary parity checks, $c^{(j)}$, $1 \le j \le K_b$. Each one of the $\gamma$ accumulators stores and updates its part of the temporary parity check bits. For the example of GL organization given in FIG. 3, the accumulator 503 is in charge of storing and processing the temporary parity check bits of the first GL, $[c_1^{(j)}; c_5^{(j)}; c_9^{(j)}; c_{13}^{(j)}]$.

The process of encoding for region $R_1$ is described in Algorithm 1. The parity check values $c^{(j)}$ are split into $\gamma$ parts, each of one being associated with one of the $\gamma$GLs. The values in $c^{(j)}$ corresponding to a specific GL are not necessarily consecutive, and are arranged in accordance with the GL organisation of the PCM (refer to paragraph 0007). Recall that the number of non-zero blocks in each column j is lower than than the number of GLs, $d_v(j) \le \gamma$, and that each one of the non-zero block belong to a different GL. As a consequence, all the parity check bits for the j-th column, $$[c_{i_1}^{(j)}; \ldots ; c_{i_{d_v(j)}}^{(j)}]$$

can be updated in parallel, with no memory access violation, both for reading and writing.

During the processing of column j in region $R_1$ the information bits $u_j$ arrive as input to the encoder core 514. For the j-th column, we indicate by $b_{k,j}$ the shift value corresponding to the single non-zero block in the k-th GL, such that $$\alpha^{b_{k,j}} = u_{i_k,j}.$$

The address in memory 511 for the temporary parity checks being processed by the k-th accumulator for column j is denoted by $a_{k,j}$. Both the shift values $b_{k,j}$ and addresses $a_{k,j}$ arrive as part of the instruction 515. $u_j$ is sent to all $\gamma$ accumulators. While the first accumulator 503 receives $b_{1,j}$ and $a_{1,j}$, the second accumulator 504 receives $b_{2,j}$ and $a_{2,j}$ and so on. The accumulators use the information bits, shift values, and addresses to update the values of $c_{i_k}^{(j)}$ stored in their memories.

The critical path during $R_1$ is equal to the number of clock cycles taken to read the memory 511, do the XOR with the barrel shifted data, and write the updated value back to the memory. If this process takes $\tau_1$ clock cycles, it follows that a minimum gap of $gap^* = \tau_1$ in matrix U is necessary to achieve maximum throughput. A value of $gap^*=2$ is usually sufficient to achieve high frequency for the synthesized architecture.

Encoding of Region $R_2$

In the region $R_2$, the encoder computes the first set of redundancy bits t, as well as the updated values of the temporary parity check vector $c^{(K_b+N_t)}$. Thanks to the special structure of the matrices T and S, this second step of encoding can be performed with a very simple algorithm, and then a very simple hardware implementation, which we explain thereafter.

Since the temporary parity check $c^{(K_b)}$ are already computed from region $R_1$ and available, the Equation (25) becomes:

$$c^{(K_b)} = Tt + \begin{bmatrix} S \\ 0 \end{bmatrix} s \quad (27)$$

In the last $N_s$ block-columns of the PCM, only the first $N_s$ block-rows contain non-zero blocks, and the $M_b - N_s$ last block-rows of these columns are all-zero. As a result, the last $N_t = M_b - N_s$ equations of the system (27) do not depend on s nor on S, and may be solved using solely the knowledge of T and $c^{(K_b)}$. Solving the last $N_t = M_b - N_s$ equations of the system (27) corresponds to the processing of region $R_2$, and produces the vector of redundancy bits t. In addition, the matrix T is upper triangular and the encoding process for region $R_2$ can be performed by a simple backward iterative encoding process. Equation (27) can be written as:

$$\begin{bmatrix} c_1^{(K_b)} \\ \vdots \\ c_{N_s}^{(K_b)} \\ \hline c_{N_s+1}^{(K_b)} \\ c_{N_s+2}^{(K_b)} \\ \vdots \\ c_{M_b}^{(K_b)} \end{bmatrix} = \begin{bmatrix} T_{1,1} & T_{1,2} & \ldots & T_{1,N_t} & S_{1,1} & \ldots & S_{1,N_s} \\ \vdots & \vdots & \vdots & \vdots & \vdots & & \vdots \\ T_{N_s,1} & T_{N_s,2} & \ldots & T_{N_s,N_t} & S_{N_s,1} & \ldots & S_{N_s,N_s} \\ \hline T_{N_s+1,1} & T_{N_s+1,2} & \ldots & T_{N_s+1,N_t} & 0 & \ldots & 0 \\ T_{N_s+2,1} & T_{N_s+2,2} & \ldots & 0 & 0 & \ldots & 0 \\ \vdots & \vdots & \vdots & \vdots & \vdots & & \vdots \\ T_{M_b,1} & 0 & \ldots & 0 & 0 & \ldots & 0 \end{bmatrix} \begin{bmatrix} t_1 \\ t_2 \\ \vdots \\ t_{N_t} \\ \hline s_1 \\ \vdots \\ s_{N_s} \end{bmatrix} \quad (28)$$

As can be seen from Equation (28), the last equation of this system allows to get the first vector of redundancy bits $t_1$ with a very simple operation.

$$t_1 = T_{M_b,1}^{-1} c_{M_b}^{(K_b)} \quad (29)$$

where $T_{M_b,1}^{-1}$ is the inverse of the CPM in the block indexed by $(M_b, 1)$ of T, which is itself a CPM.

Still using the upper-triangular property of T, we can proceed recursively from j=1 to j=$N_t$ to compute the set of redundancy bits $t_j$, $1 \le j \le N_t$. Moreover, from the definition of the vector of temporary parity checks, the j-th equation can be simplified in the following way:

$$t_j = T_{M_b-(j-1),j}^{-1} \left( c_{M_b-(j-1)}^{(K-b)} + \sum_{k=1}^{j-1} T_{M_b-(j-1),k} t_k \right) = T_{M_b-(j-1),j}^{-1} c_{M_b-(j-1)}^{(K_b+(j-1))} \quad (30)$$

Using Equations (28) and (30), one can deduce the process for encoding in region $R_2$, described in Algorithm 2. Similarly to the encoding in region $R_1$, the matrix T is composed of a subset of columns of the matrix H, and therefore is sparse. The j-th column of T is composed of $d_v(j)$ non-zero blocks. Let $(i_1, \ldots, i_{d_v(j)})$ be the block indices of the non-zero blocks, with $1 \leq i_k \leq (M_b - j + 1)$.

---

Algorithm 2: Encoding of region $R_2$

Input: vector of temporary parity checks $c^{(K_b)}$, region $R_2$ of the PCM T
Output: vector of temporary parity checks $c^{(K_b + N_t)}$, first set of redundancy bits t
for j = 1 to $N_t$ do
| Step-a: compute $t_j$ from Equation (30),
| Step-b: compute the block indices of the non-zero blocks in column
|     j of T: $(i_1, \ldots, i_{d_v(j)})$,
| Step-c: compute the updated parity check values:
|     for k = 1 to $d_v(j)$ do
|     |   $c_{i_k}^{(K_b + j)} = c_{i_k}^{(K_b + (j-1))} + T_{i_k, j} t_j$
|     end
end

---

The values of the temporary parity checks along the encoding process do not need to be stored, as only the last values $c^{(K_b + N_t)}$ are needed for the third step. The temporary parity check values can be efficiently stored into a single vector, initialized to $c^{(K_b)}$ and updated sequentially using Algorithm 2.

In a preferred embodiment of the invention, the PCM is organized in $\gamma$ interleaved generalized layers, such that the $d_v(j)$ non-zero blocks in each and every column of U belong to different generalized layers. An example of the preferred embodiment is when the QC-LDPC code is strictly regular, with $d_v(j) = d_v = \gamma$. In this case, the matrix T is formed of $d_v$ generalized layers, each of one containing exactly one non-zero block per column. Under this preferred embodiment, the $d_v(j)$ computations of Step-c in Algorithm 2 can be performed in parallel, using a multiplicity of $d_v(j)$ circuits, without any memory access violation. Further details on the hardware realization of this step are described in the next paragraph.

Hardware Realization of Encoding of Region $R_2$

To simplify the description of the hardware for the encoding of region $R_2$, we assume without loss of generality that the CPM on the diagonal of T are identity matrices. Note that one can easily enforce this constraint for any QC-LDPC code following the structure of (11), by simple block-row and block-column transformations. With this constraint Step-a in Algorithm 2 simplifies to $$t_j = c_{M_b - (j-1)}^{(K_b + (j-1))}$$

where j is the column index within region $R_2$.

Since the temporary parity checks c are stored in the accumulator memories, outputting the values of the L redundancy bits $t_j$ requires a simple reading the correct address from the correct memory and outputting those L bits. The rest of the processing for region $R_2$ reduces to updating the values of $c_{i_k}$, as described in Step-c of Algorithm 2.

Figure 6:
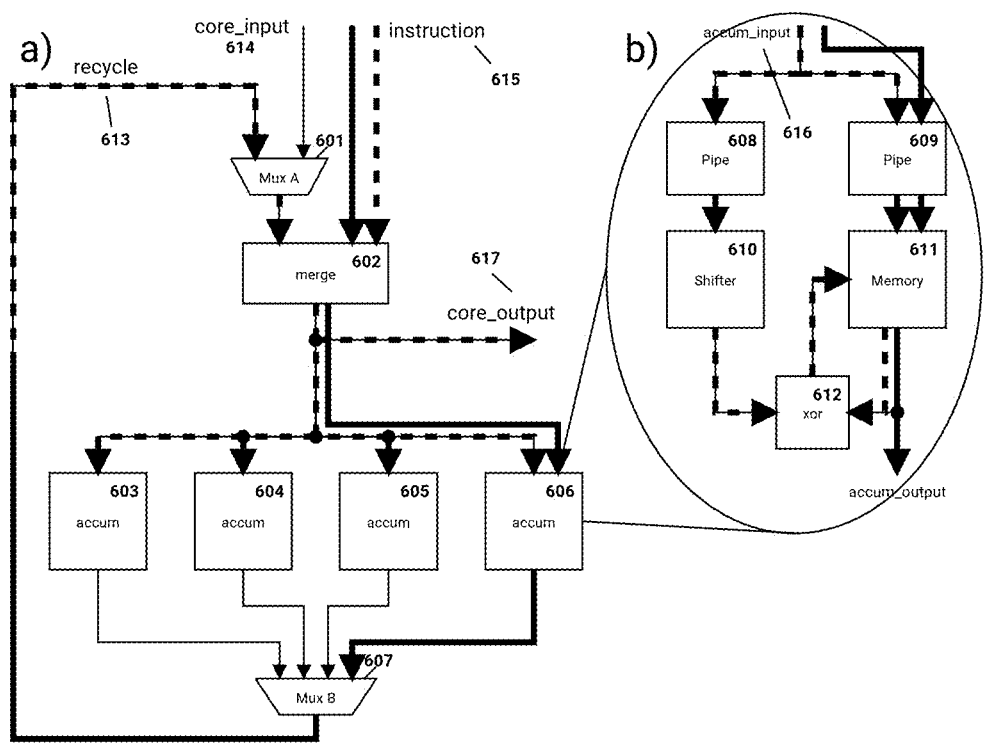
FIG. 6 describes the encoding hardware usage in Region $R_2$, with two parts: a) Core encoding hardware, and b) Accumulator hardware.

FIG. 6 shows the path of data and instructions required to process one column in region $R_2$. The input of the core 614 is not used in this region. Two sequential use of the hardware, driven by two different instructions 615 are necessary to process one column. The processing associated with the first instruction, named stage 2a, is shown in thick solid arrows, and the processing associated with the second instruction, named stage 2b, is shown in thick dashed arrows. The recycle stream 613 is shown as have solid and half dashed because it is produced by the first instruction, but used as input by the second instruction.

During stage 2a, the first instruction contains the memory addresses $a_{k,j}$ of $$c_{M_b - (j-1)}^{(K_b + (j-1))},$$

used in the k-th accumulator, and an indicator telling in which memory, i.e. in which accumulator, the values are stored. This last instruction is used by Mux B 607. In the example drawn in FIG. 6, the temporary parity check values are stored in accumulator 606. The value of $$c_{M_b - (j-1)}^{(K_b + (j-1))}$$

goes in the recycle stream 613, where it is acted upon by the second instruction.

During stage 2b, the second instruction tells to output $$c_{M_b - (j-1)}^{(K_b + (j-1))}$$

on the core output 617 and also send it as input to the $\gamma$ accumulators, where together with the addresses $a_{k,j}$ and shift values $b_{k,j}$ from the second instruction, it is used to update the $$c_{i_k}^{(K_b + j)}$$

values.

The time between stage 2a and stage 2b processing depends on the length of the pipeline given by the thick solid line. To achieve high throughput, the first instruction and second instruction for different columns are interleaved. Table 1 shows an example of how the instructions might be interleaved if the pipeline for the first instruction takes three clock cycles.

TABLE 1

| Clock Cycle | Instruction |
| --- | --- |
| 1 | first instruction for j = 0 |
| 2 | pause |
| 3 | first instruction for j = 1 |
| 4 | second instruction for j = 0 |
| 5 | first instruction for j = 2 |
| 6 | second instruction for j = 1 |
| 7 | first instruction for j = 3 |
| 8 | second instruction for j = 2 |
| 9 | . . . |

To allow this interleaving it is desirable that the pipeline for the first instruction takes an odd number of clock cycles.

In region $R_2$, the time $\tau_1$ to read and then update the memory is not the critical path anymore. The time $\tau_2$ between reading from a temporary parity check associated with the diagonal, to updating the parity check associated in a different memory, becomes dominant. This path goes from the memory 611 out of the accumulator 606, through Mux B 607, Mux A 601, merging block 602, back into a different accumulator, through the pipe 608, barrel shifter 610, XOR 612 and finally back to the memory 611. The final writing in the memory must be completed before reading the diagonal parity for that memory address. For example, if $\tau_2$ is 5 clock cycles, then a gap=3 is necessary between the diagonal block and the other blocks of the same block-row, for the throughput to be maximum. Indeed, A path which takes 5 clock cycles imposes a gap constraint on the corresponding block-row of gap=3 since two instructions are required for every column. A gap=3 means that there will be 6 clock cycles between the first instruction of the first column, and the first instruction of the next column which requires that updated data. These 6 clock cycles are sufficient for a pipeline of length $\tau_2$=5.

For blocks outside the diagonal, the gap constraint is more relaxed. If the pipeline length for $\tau_1$ is 2 clock cycles, then no gap constraint is imposed since we already need 2 clock cycles to process each column. As mentioned in paragraph 0044, a pipeline length of 2 clock cycles for $\tau_1$ is usually sufficient to achieve high frequency for the synthesized architecture.

Encoding of Region $R_3$

In the region $R_3$, the encoder computes the last part of the codeword, i.e. the vector of redundancy bits s, using:

$$c^{(K_b+N_t)} = Uu + Tt = \begin{bmatrix} S \\ 0 \end{bmatrix} s \tag{31}$$

The first $N_s$ equations of the system in Equation (31) are sufficient to get those values:

$$c_{1:N_s}^{(K_b+N_t)} = \begin{bmatrix} c_1^{(K_b+N_t)} \\ c_2^{(K_b+N_t)} \\ \vdots \\ c_{N_s}^{(K_b+N_t)} \end{bmatrix} = \begin{bmatrix} S_{1,1} & S_{1,2} & \cdots & S_{1,N_s} \\ S_{2,1} & S_{2,2} & \cdots & S_{2,N_s} \\ \vdots & \vdots & \vdots & \vdots \\ S_{N_s,1} & S_{N_s,2} & \cdots & S_{N_s,N_s} \end{bmatrix} \begin{bmatrix} s_1 \\ s_2 \\ \vdots \\ s_{N_s} \end{bmatrix} \tag{32}$$

where $$c_{1:N_s}^{(K_b+N_t)}$$

gather the first $N_s$ values of vector $c^{(K_b+N_t)}$

In this disclosure, the matrix S is assumed to have full rank, and therefore is invertible. Let $A=S^{-1}$ denote its inverse. The vector of redundancy bits s is computed using:

$$s = S^{-1} c_{1:N_s}^{(K_b+N_t)} = A c_{1:N_s}^{(K_b+N_t)} \tag{33}$$

As explained in paragraph 006, A is composed of possibly large weight circulant blocks. Let $w_{i,j}$ denote the weight of the circulant in $A_{i,j}$. The typical weight of an inverse of a general circulant is close to L/2, which could lead to a large hardware complexity and/or a low encoding throughput. Although this invention applies to arbitrary matrices with any inverse weight, the efficiency of our encoder relies on matrices S for which the inverse is composed of low weight circulants, i.e. $w_{i,j} \ll L/2$, $1 \leq i, j \leq N_s$. We obtain such low weight inverse matrix by an optimized selection of the CPM shifts in S. Some examples are given in paragraphs 0049 and 0050.

This invention describes how to utilize a sparse representation of matrix A by relying on a special technique, described as follows. First, A is expanded into a rectangular matrix E, composed only of CPMs. Let us recall that A is composed of general circulant blocks, with weights $w_{i,j}$, $1 \leq i,j \leq N_s$. Each block in A can be written as:

$$A_{i,j} = \sum_{k=1}^{w_{i,j}} A_{i,j}^{(k)} \tag{34}$$

where $A_{i,j}^{(k)}$, $\forall k$ is a CPM.

Let $w_{max,j} = \max_i \{w_{i,j}\}$ be the maximum circulant weight in block-column j of A, $1 \leq j \leq N_s$. When the weight of a circulant is smaller than the maximum weight of the corresponding column, we further impose that $A_{i,j}^{(k)}=0$, for $w_{i,j} \leq k \leq w_{max,j}$, such that:

$$A_{i,j} = \sum_{k=1}^{w_{i,j}} A_{i,j}^{(k)} = \sum_{k=1}^{w_{max,j}} A_{i,j}^{(k)} \tag{35}$$

$$1 \leq i \leq N_s$$

The expanded matrix E is composed of the concatenation of columns deduced from Equation (35):

$$E = \begin{bmatrix} A_{1,1}^{(1)} & \cdots & A_{1,1}^{(w_{max,1})} & \cdots & \cdots & \cdots & A_{1,N_s}^{(1)} & \cdots & A_{1,N_s}^{(w_{max,N_s})} \\ A_{2,1}^{(1)} & \cdots & A_{2,1}^{(w_{max,1})} & \cdots & \cdots & \cdots & A_{2,N_s}^{(1)} & \cdots & A_{2,N_s}^{(w_{max,N_s})} \\ \vdots & \vdots & \vdots & \vdots & \vdots & \vdots & \vdots & \vdots & \vdots \\ A_{N_s,1}^{(1)} & \cdots & A_{N_s,1}^{(w_{max,1})} & \cdots & \cdots & \cdots & A_{N_s,N_s}^{(1)} & \cdots & A_{N_s,N_s}^{(w_{max,N_s})} \end{bmatrix} \tag{36}$$

and we denote by $E_j$ the expansion of the j-th block-column of A, such that $E=[E_1, \ldots, E_{N_s}]$. E is therefore a sparse rectangular matrix, of size ($N_s$, $\Sigma_j w_{max,j}$), composed only of CPMs.

Figure 7:
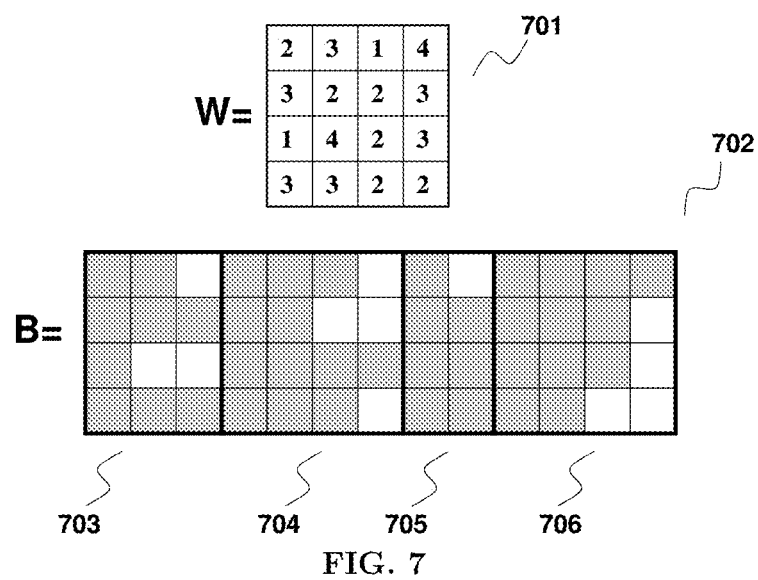
FIG. 7 illustrates the procedure of expansion of a dense block-circulant matrix into a sparse representation.

An example of the expansion from A to E is shown in figure FIG. 7, for the case of $N_s$=4. The matrix of the circulant weights for the inverse A is shown with 701. The matrix E is shown with 702, and the four columns of A are expanded into four block matrices ($E_1$, $E_2$, $E_3$, $E_4$) labeled 703 to 706. The gray blocks represent the locations of the CPMs, while the white blocks indicate that the block is all-zero. We show the general case where the maximum column weights $w_{max,j}$ may be different from each other. In this example, we have $w_{max,1}$=3, $w_{max,2}$=4, $w_{max,3}$=2 and $w_{max,4}$=4. We can also see with this example that the expanded matrix has an irregular distribution of the number of CPM in each column. Let us denote by $d_v(j,n)$ the number of CPM in the n-th column of $E_j$.

The encoding of the redundancy bits s can be made using E instead of A, since (33) can be written as:

$$s = [E_1, \ldots, E_{N_s}] \begin{bmatrix} c_1^{(K_b+N_t)} \\ \vdots \\ c_1^{(K_b+N_t)} \\ \vdots \\ c_{N_s}^{(K_b+N_t)} \\ \vdots \\ c_{N_s}^{(K_b+N_t)} \end{bmatrix} \quad (37)$$

where $c_j^{(K_b+N_t)}$ is copied $w_{max,j}$ times in the right hand side vector c. The Algorithm 3 is used to compute the second set of redundancy bits s, deduced from Equation (37). In the algorithm, $E_j(i,n)$ represents the CPM in the i-th row and the n-th column of matrix $E_j$.

For example in the matrix E of FIG. 7, the matrix $E_3$ 705 can be written as $$E_3 = \begin{bmatrix} E_3(1,1) & 0 \\ E_3(2,1) & E_3(2,2) \\ E_3(3,1) & E_3(3,2) \\ E_3(4,1) & E_3(4,2) \end{bmatrix} \quad (38)$$

---

Algorithm 3: Encoding of region $R_3$

Input: vector of temporary parity checks $c_{1:N_s}^{(K_b + N_t)}$, sparse inverse representation E of region $R_3$ of the PCM
Output: second set of redundancy bits s
Step-a: initialize s = 0
for j = 1 to $N_s$ do
| for n = 1 to $w_{max,j}$ do
| | Step-b: compute the block indices of the non-zero blocks in column
| |   n of $E_j$: $(i_1,\ldots,i_{d_v(j,n)})$,
| | Step-c: compute the updated redundancy bits:
| | for k = 1 to $d_v(j,n)$ do
| |   $s_{i_k} = s_{i_k} + E_j(i_k, n) c_j^{(K_b + N_t)}$
| | end
| end
end

---

In a preferred embodiment of the invention, the size of the matrix S is chosen to be a multiple of the number of generalized layers γ, $N_s$=l γ. This preferred embodiment allows to re-use for region $R_3$ the hardware developed for region $R_1$ and $R_2$, as explained in the next paragraph. Two use case of this preferred embodiment are described in paragraphs 0049 and 0050.

Hardware Realization of Encoding of Region $R_3$

There are two steps to output the second set of redundancy bits s in region $R_3$.

First the vector $$c_{1:N_s}^{(K_b+N_t)}$$

is multiplied by the sparse representation E of inverse matrix A (37) and the resulting bits s are stored in the accumulator memories. We refer to this as stage 3a. Once computed, the values of s are read from the accumulator memories and output to 817. We refer to this second step as stage 3b.

During stage 3a, the values of s need to be iteratively updated and stored in the accumulators 803 to 806. In principle, one would need an use additional memory to store s, but here we will capitalize on the special structure of the PCM (11). Indeed, at the end of region $R_2$ processing, thanks to the upper triangular structure of T, the temporary parity checks $$c_{N_s+1:M_b}^{(K_b+N_t)}$$

are all zero, and do not need to be updated or used during the processing of region $R_3$. We propose in this invention to use $N_s/γ$ addresses of the available memory in each of the γ accumulator memories 811, to store the values of s. For example, one could use the memory addresses which correspond to $$c_{N_s+1:2N_s}^{(K_b+N_t)}.$$

The processing for stage 3a is similar to the processing in region $R_2$. The core input 814 is not used, and the main difference is that after the value of $c_j$ is read from an accumulator memory, the values of s are updated $w_{max,j}$ times, instead of one update in region $R_2$. During the $w_{max,j}$ updates corresponding to Step-c in Algorithm 3, the values of $c_j$ are hold in registers in the merge module 802. In total, for stage 3a, there is then a sequence of $N_s$ read instructions to retrieve the values of the temporary parity checks $$c_{1:N_s}^{(K_b+N_t)},$$

and $\Sigma_{1 \leq j \leq N_s} w_{max,j}$ update instructions to compute the values of redundancy bits s and store them in the accumulator memories, at the addresses of $$c_{N_s+1:2N_s}^{(K_b+N_t)}.$$

Figure 8:
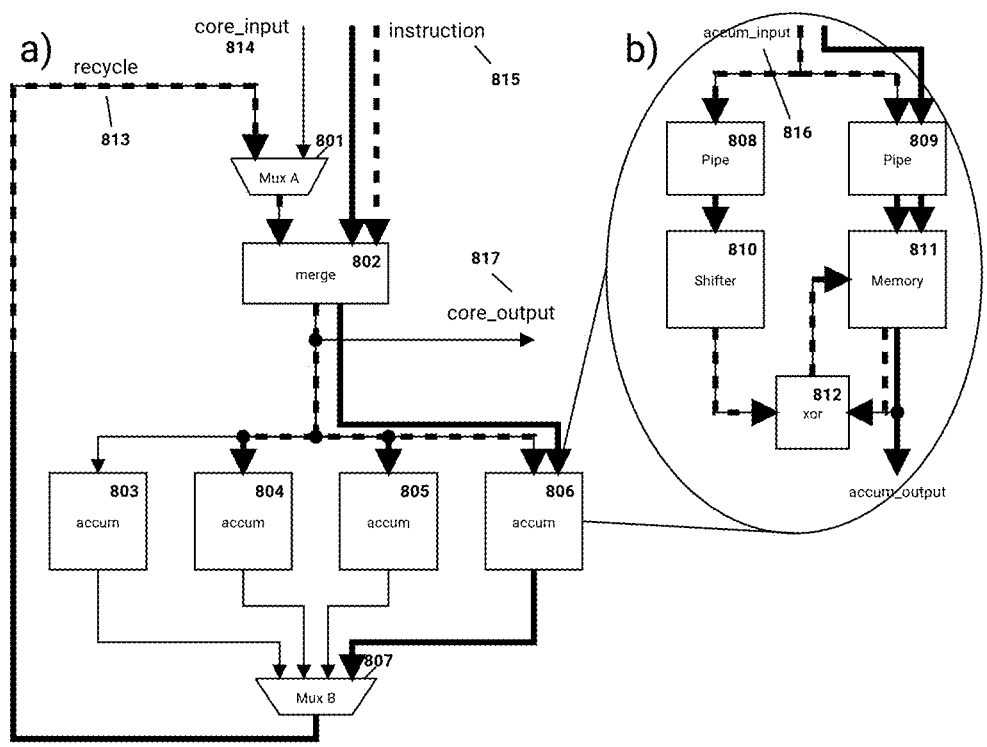
FIG. 8 describes the encoding hardware usage in Region $R_3$ for first and second instruction types, with two parts: a) Core encoding hardware, and b) Accumulator hardware.

FIG. 8 shows the flow of instructions and data during the processing of stage 3a. The processing of the read instruction is shown as solid thick arrows, and the processing of an update instruction is shown as dashed thick arrows.

As in region $R_2$, we can also interleave the instructions to maximize the throughput, but with more pauses in the sequence because of the fact that there are more update instructions than read instructions. Table 2 shows an example of a sequence of interleaved instructions to calculate s, for the case of $N_s$=γ=4, when the inverse matrix A has maximum weights $w_{max,1}$=3, $w_{max,2}$=2, $w_{max,3}$=1 and $w_{max,4}$=4.

TABLE 2

| Clock Cycle | Instruction |
|---|---|
| 1 | read instruction for block-column 1 |
| 2 | pause |
| 3 | pause |
| 4 | update instruction 1 for block-column 1 |
| 5 | pause |
| 6 | update instruction 2 for block-column 1 |
| 7 | read instruction for block-column 2 |
| 8 | update instruction 3 for block-column 1 |

TABLE 2-continued

| Clock Cycle | Instruction |
| --- | --- |
| 9 | pause |
| 10 | update instruction 1 for block-column 2 |
| 11 | read instruction for block-column 3 |
| 12 | update instruction 2 for block-column 2 |
| 13 | read instruction for block-column 4 |
| 14 | update instruction 1 for block-column 3 |
| 15 | pause |
| 16 | update instruction 1 for block-column 4 |
| 17 | pause |
| 18 | update instruction 2 for block-column 4 |
| 19 | pause |
| 20 | update instruction 3 for block-column 4 |
| 21 | pause |
| 22 | update instruction 4 for block-column 4 |

Figure 9:
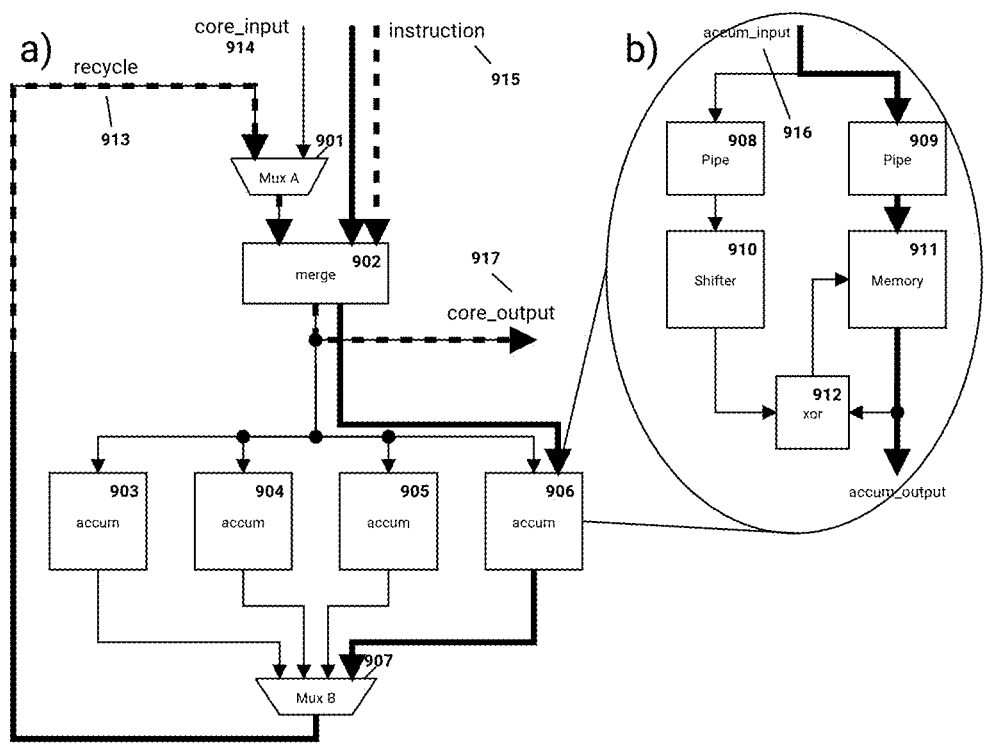
FIG. 9 describes the encoding hardware usage in Region $R_3$ for third and fourth instruction types, with two parts: a) Core encoding hardware, and b) Accumulator hardware.

Once s is calculated and stored in the accumulator memories, stage 3b begins and the values of s are read from the accumulator memories and output to the stream 917. For each of the $N_s$ values of s, one read instruction and one output instruction is required. FIG. 9 shows the flow of data and instructions for stage 3b. The processing of the read instruction is shown as solid thick arrows, and the processing of an output instruction is shown as dashed thick arrows. The read and output instructions for each $s_i$ can be interleaved to improve the throughput, as described in Table 3 for the case of $N_s=\gamma=4$.

TABLE 3

| Clock Cycle | Instruction |
| --- | --- |
| 1 | read instruction for $s_1$ |
| 2 | pause |
| 3 | read instruction for $s_2$ |
| 4 | output instruction for $s_1$ |
| 5 | read instruction for $s_3$ |
| 6 | output instruction for $s_2$ |
| 7 | read instruction for $s_4$ |
| 8 | output instruction for $s_3$ |
| 9 | pause |
| 10 | output instruction for $s_4$ |

Region $R_3$ Encoding with S of Size $(N_s \times N_s) = (\gamma \times \gamma)$ In a preferred embodiment of the invention, the matrix S has the size of the number of generalized layers $N_s = \gamma$. Let us recall that S must be full rank to be able compute its inverse. For this purpose, the CPM organization in S has to follow some constraints, and the values of the CPM $S_{i,j}$ have also to be chosen carefully.

In the preferred embodiment described in this paragraph, the CPM $S_{i,j}$ are chosen so that the following constraints are satisfied:
 the matrix S is full rank,
 the matrix S has a given girth g>4,
 the inverse matrix A is composed of low weight circulants.

We give several examples with two different structures of such matrices, for the special case of $\gamma=4$. Generalizations to other values of $\gamma$ or other organizations of the CPM in S can be easily derived from these examples. In these examples of the preferred embodiment, the matrix S has size 4×4 blocks, and therefore a minimum of 3 all-zero blocks are necessary to make it full rank.

1. In the first structure, denoted $S3_g$, we present solutions for the choice of CPM in S when the number of all-zero blocks is equal to 3, and the girth of the Tanner graph corresponding to S is equal to g. Without loss of generality, we can assume that the CPM in the first block-row and the first block-column of S are equal to the Identity matrix, i.e. $S_{1,j}=S_{i,1}=\alpha^0$, $\forall(i,j)$. Indeed, with any other choice of the CPM, the first block-row and the first block-column of S can be transformed into $\alpha^0$ by matrix transformation. Also without loss of generality, we assume that the 3 all-zero blocks are organized in the following manner:

$$S3_g = \begin{bmatrix} \alpha^0 & \alpha^0 & \alpha^0 & \alpha^0 \\ \alpha^0 & 0 & S_{2,3} & S_{2,4} \\ \alpha^0 & S_{3,2} & 0 & S_{3,4} \\ \alpha^0 & S_{4,2} & S_{4,3} & 0 \end{bmatrix}. \quad (39)$$

Any other location of the 3 all-zero blocks can be obtained by performing blockrow/column permutations. The six CPMs $(S_{2,3}, S_{2,4}, S_{3,2}, S_{3,4}, S_{4,2}, S_{4,3})$ are chosen such that $S3_g$ has girth g, is full rank, and its inverse A has the lowest possible sum of its maximum column weight, i.e. such that $\Sigma_{j=1}^4 w_{max,j}$ is minimum.

2. In the second structure, denoted $S4_g$, we present solutions for the choice of CPM in S when the number of all-zero blocks in S is equal to 4, and the girth of the Tanner graph corresponding to S is equal to g. The reason in considering 4 all-zero blocks instead of 3 as in the previous structure is that the weights of the circulants in the inverse A are generally smaller. Generalizations to matrices S with more than 4 zeros are also allowed, as long as S is full rank. Like in the previous structure, we can assume that the CPM in the first block-row and the first block-column of S are equal to the Identity matrix, and that the all-zero blocks are organized in the following manner:

$$S4_g = \begin{bmatrix} 0 & \alpha^0 & \alpha^0 & \alpha^0 \\ \alpha^0 & 0 & S_{2,3} & S_{2,4} \\ \alpha^0 & S_{3,2} & 0 & S_{3,4} \\ \alpha^0 & S_{4,2} & S_{4,3} & 0 \end{bmatrix} \quad (40)$$

The six CPMs $(S_{2,3}, S_{2,4}, S_{3,2}, S_{3,4}, S_{4,2}, S_{4,3})$ are chosen such that $S4_g$ has girth g, is full rank, and its inverse A has the lowest possible sum of its maximum column weight, i.e. such that $\Sigma_{j=1}^4 w_{max,j}$ is minimum.

Six examples of the preferred embodiment following structures $S3_g$ and $S4_g$ are given in equations (41) to (46), for different values of the target girth g ∈ {6, 8, 10}, and a circulant size L=32. In each example, we report the CPMs chosen in matrix S, and the matrix of circulant weights W of its inverse. Generalization to other circulant sizes L or other girths g are obtained using the same constrained design as described in this paragraph. Note the given examples are not unique, and that there exist other CPM choices that lead to the same value of $\Sigma_{j=1}^4 w_{max,j}$.

As one can see, the weights of the circulants in W are quite low, especially for girth g=6 or g=8.

$$S3_6 = \begin{bmatrix} 0 & \alpha^0 & \alpha^0 & \alpha^0 \\ \alpha^0 & 0 & \alpha^1 & \alpha^{16} \\ \alpha^0 & \alpha^{16} & 0 & \alpha^{15} \\ \alpha^0 & \alpha^1 & \alpha^{17} & 0 \end{bmatrix} \quad W3_6 = \begin{bmatrix} 0 & 3 & 3 & 3 \\ 3 & 3 & 2 & 2 \\ 3 & 2 & 3 & 2 \\ 3 & 2 & 2 & 3 \end{bmatrix} \quad (41)$$

-continued $$S3_8 = \begin{bmatrix} \alpha^0 & \alpha^0 & \alpha^0 & \alpha^0 \\ \alpha^0 & 0 & \alpha^1 & \alpha^2 \\ \alpha^0 & \alpha^{25} & 0 & \alpha^{28} \\ \alpha^0 & \alpha^{30} & \alpha^4 & 0 \end{bmatrix} \quad W3_8 = \begin{bmatrix} 2 & 3 & 3 & 3 \\ 3 & 3 & 4 & 4 \\ 3 & 4 & 3 & 4 \\ 3 & 4 & 4 & 3 \end{bmatrix} \quad (42)$$

$$S3_{10} = \begin{bmatrix} \alpha^0 & \alpha^0 & \alpha^0 & \alpha^0 \\ \alpha^0 & 0 & \alpha^1 & \alpha^3 \\ \alpha^0 & \alpha^9 & 0 & \alpha^{17} \\ \alpha^0 & \alpha^{11} & \alpha^{25} & 0 \end{bmatrix} \quad W3_{10} = \begin{bmatrix} 12 & 13 & 5 & 13 \\ 13 & 13 & 14 & 10 \\ 5 & 12 & 15 & 12 \\ 13 & 10 & 14 & 13 \end{bmatrix} \quad (43)$$

$$S4_6 = \begin{bmatrix} 0 & \alpha^0 & \alpha^0 & \alpha^0 \\ \alpha^0 & 0 & \alpha^0 & \alpha^{16} \\ \alpha^0 & \alpha^{16} & 0 & \alpha^0 \\ \alpha^0 & \alpha^0 & \alpha^{16} & 0 \end{bmatrix} \quad W4_6 = \begin{bmatrix} 2 & 1 & 1 & 1 \\ 1 & 2 & 1 & 1 \\ 1 & 1 & 2 & 1 \\ 1 & 1 & 1 & 2 \end{bmatrix} \quad (44)$$

$$S4_8 = \begin{bmatrix} 0 & \alpha^0 & \alpha^0 & \alpha^0 \\ \alpha^0 & 0 & \alpha^0 & \alpha^1 \\ \alpha^0 & \alpha^{14} & 0 & \alpha^{16} \\ \alpha^0 & \alpha^{15} & \alpha^{30} & 0 \end{bmatrix} \quad W4_8 = \begin{bmatrix} 2 & 3 & 3 & 3 \\ 3 & 2 & 3 & 3 \\ 3 & 3 & 2 & 3 \\ 3 & 3 & 3 & 2 \end{bmatrix} \quad (45)$$

$$S4_{10} = \begin{bmatrix} 0 & \alpha^0 & \alpha^0 & \alpha^0 \\ \alpha^0 & 0 & \alpha^1 & \alpha^3 \\ \alpha^0 & \alpha^{25} & 0 & \alpha^{21} \\ \alpha^0 & \alpha^{27} & \alpha^{13} & 0 \end{bmatrix} \quad W4_{10} = \begin{bmatrix} 4 & 9 & 5 & 9 \\ 5 & 4 & 5 & 5 \\ 5 & 9 & 4 & 9 \\ 5 & 5 & 5 & 4 \end{bmatrix} \quad (46)$$

Region $R_3$ Encoding with S of Size $(N_s \times N_s) = (l\gamma \times l\gamma)$ We present in this paragraph a preferred embodiment of the invention, when the size of the matrix S is l times the number of GLs, with l>1. For ease of presentation, we present only the case of $\gamma=4$ and l=2. One skilled in the art can easily extend this example to larger values of l, and other values of $\gamma$.

Although applicable to any matrix S of size (l $\gamma \times$ l $\gamma$), the implementation of region $R_3$ described in paragraphs 0047 and 0048 can become cumbersome when the matrix S is large. This is due to the fact that the inverse of S when l≥2 is generally not sparse anymore, which leads to a large increase in computational complexity or an important decrease of the encoding throughput.

Instead, we propose in this invention to impose a specific structure on the matrix S, which allows to make a recursive use of the encoder presented in paragraph 0049 for $\gamma \times \gamma$ matrices. The proposed structure is presented in the following equation for $\gamma=4$:

$$S = \begin{bmatrix} \begin{array}{cccc} S_{1,1} & 0 & 0 & 0 \\ 0 & S_{2,2} & 0 & 0 \\ 0 & 0 & S_{3,3} & 0 \\ 0 & 0 & 0 & S_{4,4} \end{array} & S' \\ \hline S'' & \begin{array}{cccc} 0 & 0 & 0 & 0 \\ 0 & 0 & 0 & 0 \\ 0 & 0 & 0 & 0 \\ 0 & 0 & 0 & 0 \end{array} \end{bmatrix} \quad (47)$$

where S' and S'' are $\gamma \times \gamma$ matrices following the constraints of paragraph 0049, i.e. S'=$S3_g$, or S'=$S4_g$, and S''=$S3_g$, or S''=$S4_g$. This means in particular that S', respectively S'', have both low weight inverses, denoted A', respectively A''.

One can expand the inverse into their sparse representation, following Equation (36), to obtain matrices E', respectively E''. Encoding the vector of redundancy bits s using the structure (47) requires therefore two recursive steps of the method that was presented in paragraph 0047:

1. Use Algorithm 3 with inputs $$c_{(\gamma+1):2\gamma}^{(K_b+N_t)}$$

and matrix E'', to obtain the vector of redundancy bits $[s_1; \ldots; s_\gamma]$, 2. Accumulate the temporary parity check bits $$c_{1:\gamma}^{(K_b+N_t)}$$

with the newly computed redundancy bits:

$$c_{1:\gamma}^{(K_b+N_t+\gamma)} = c_{1:\gamma}^{(K_b+N_t)} + \begin{bmatrix} S_{1,1} & 0 & 0 & 0 \\ 0 & S_{2,2} & 0 & 0 \\ 0 & 0 & S_{3,3} & 0 \\ 0 & 0 & 0 & S_{4,4} \end{bmatrix} \begin{bmatrix} s_1 \\ \vdots \\ s_\gamma \end{bmatrix} \quad (48)$$

3. Use Algorithm 3 with inputs $$c_{1:\gamma}^{(K_b+N_t+\gamma)}$$

and matrix E', to obtain the vector of redundancy bits $[s_{\gamma+1}; \ldots; s_{2\gamma}]$, At the end of these three steps, we finally obtain the vector of redundancy bits $[s_1; \ldots; s_\gamma; s_{\gamma+1} \ldots; s_{2\gamma}]$ to complete the codeword. The hardware realization of this preferred embodiment is based on the use of the hardware presented in paragraph 0048.

Encoding with Two Regions Only: $R_1$ and $R_3$

There are situations when the dimensions of the PCM are not sufficiently large to allow an organization in three regions as described in Equation (11). Indeed, when $N_s = M_b$, it results from equations (12)-(14) that $N_t = 0$ and the region $R_2$ does not exist. The structure of the PCM becomes:

$$H = \begin{bmatrix} U_{M_u \times N_u} & \begin{array}{c} S_{N_s \times N_s} \\ 0_{(M_b - N_s) \times N_s} \end{array} \end{bmatrix} \quad (49)$$

and the codeword has only two parts, i.e. x=[u; s].

In such case, the invention presented in this disclosure consists of only two sequential steps:

Step 1: The first step computes the temporary parity checks vector $c^{(K_b)}$ using region $R_1$, i.e. $c^{(K_b)}$=U u. The step corresponding to region $R_2$ is skipped since $c^{(K_b+N_t)} = c^{(K_b)}$, Step 2: The second step computes the vector of redundancy bits s using $R_3$, with the values of $c^{(K_b)}$ as input.

The methods and hardware implementations related to regions $R_1$ and $R_3$ remain unchanged, and follow the descriptions of paragraphs 0043, 0044, 0047 and 0048. In the case of $N_s = M_b = \gamma$, the region $R_3$ is implemented as in paragraph 0049, and in the case of $N_s=M_b=1\gamma$, the region $R_3$ is implemented as in paragraph 0050.

What is claimed:

1. A encoding method comprising:
receiving as input a set of information bits;
computing a first set of temporary parity check bits using the set of information bits and a first submatrix of a first region of a parity check matrix of a quasi-cyclic, low-density parity check (LDPC) code, the first submatrix composed of columns of a first subset of the parity check matrix;
computing a second set of temporary parity check bits and a first set of redundancy bits using the first set of temporary parity check bits and a second submatrix of a second region of the parity check matrix, the second submatrix composed of columns of a second subset of the parity check matrix;
computing a second set of redundancy bits using the second set of temporary parity check bits from the second region and a third submatrix of a third region of the parity check matrix, the third submatrix composed of columns of a third subset of the parity check matrix;
combining the set of information bits, the first set of redundancy bits and the second set of redundancy bits to form a codeword of the quasi-cyclic LDPC code; and
outputting said codeword.

2. The encoding method of claim 1, wherein the first submatrix of the first region is organized into generalized layers, where a number of the generalized layers is at least equal to the maximum block-column degree of the parity check matrix, the method further comprising:
recursively accumulating the first set of temporary parity check bits and storing the first set of temporary bits in a number of separate memories, the number of separate memories equal to the number of generalized layers.

3. The encoding method of claim 1, wherein the second submatrix of the second region is in the form of a block upper-triangular matrix, the method further comprising:
recursively accumulating the second set of temporary parity check bits and storing the second set of temporary bits in a memory; and
concurrently computing the first set of redundancy bits using the diagonal blocks of the second submatrix of the second region by simple evaluation of the memory content.

4. The encoding method of claim 1, wherein the second submatrix of the second region is in the form of a block upper-triangular matrix and organized into generalized layers, where a number of the generalized layers is at least equal to the maximum block column degree of the parity check matrix, the method further comprising:
recursively accumulating the second set of temporary parity check bits of the second region and storing the second set of temporary parity check bits in a number of separate memories, the number of separate memories equal to the number of generalized layers; and
concurrently computing the first subset of redundancy bits using the diagonal blocks of the second submatrix of the second region by simple evaluation of the memories content.

5. The encoding method of claim 1, wherein the third submatrix of the third region is formed from a vertical concatenation of an invertible square submatrix with an all-zero submatrix, the method further comprising:

expanding the inverse of the invertible square submatrix of the third region block-column-wise into a secondary matrix composed only of circulant permutation matrices; and
computing the second subset of redundancy bits by recursive accumulation of temporary parity check bits, traversing the block-columns of the expanded secondary matrix.

6. The encoding method of claim 5, further comprising a third submatrix in the third region such that the inverse of the square invertible submatrix is composed of low-weight circulant matrices, and the expanded secondary matrix has a small number of block-columns.

7. The encoding method of claim 6, wherein a maximum weight of circulants matrices composing the inverse of the square invertible submatrix is 15.

8. The encoding method of claim 1, wherein the third submatrix in the third region is composed of four square block submatrices, one of which is an all-zero matrix, one of which contains one circulant permutation matrix in each row-block and each column-block, and two of which are square invertible submatrices, vertically concatenated with an all-zero submatrix, the method further comprising:
expanding a first inverse of a first square invertible submatrix block-column wise into a first secondary matrix composed only of circulant permutation matrices;
expanding a second inverse of a second square invertible submatrix block-column wise into a second secondary matrix composed only of circulant permutation matrices;
computing a first part of the second subset of redundancy bits by recursive accumulation of temporary bits, traversing the block-columns of the first expanded secondary matrix and storing them in a memory;
updating the temporary parity check bits of the first part of the third region using the first part of the second subset of redundancy bits, and the square submatrix which contains one circulant permutation matrix in each row-block and each column-block; and
computing a second part of the second subset of redundancy bits by recursive accumulation of temporary parity check bits, traversing the block-columns of the second expanded secondary matrix.

9. The encoding method of claim 8, further comprising a third submatrix in the third region such that the inverses of the two square invertible submatrices are composed of low-weight circulant matrices, and the expanded secondary matrices have a small number of block-columns.

10. The encoding method of claim 9, wherein the maximum weight of circulants matrices composing the inverses of the two square invertible submatrices is 15.

11. A encoding method comprising:
receiving as input a set of information bits;
computing a set of temporary parity check bits using the set of information bits and a first submatrix of a first region of a parity check matrix of a quasi-cyclic, low-density parity check (LDPC) code, the first submatrix composed of columns of a first subset of the parity check matrix;
computing the set of redundancy bits using the set of temporary parity check bits from the first region and a second submatrix of a second region of the parity check matrix, the second submatrix composed of columns of a second subset of the parity check matrix;

combining the set of information bits and the set of redundancy bits to form a codeword of the quasi-cyclic LDPC code; and outputting said codeword.

12. The encoding method of claim 11, wherein the second submatrix of the second region is formed from a vertical concatenation of an invertible square submatrix with an all-zero submatrix, the method further comprising:

expanding the inverse of the invertible square submatrix of the second region block-column-wise into a secondary matrix composed only of circulant permutation matrices; and computing the set of redundancy bits by recursive accumulation of temporary parity check bits, traversing the block-columns of the expanded secondary matrix.

13. The encoding method of claim 12, further comprising a second submatrix in the second region such that the inverse of the square invertible submatrix is composed of low-weight circulant matrices, and the expanded secondary matrix has a small number of block-columns.

14. The encoding method of claim 13, wherein a maximum weight of circulants matrices composing the inverse of the square invertible submatrix is 15.

15. The encoding method of claim 11, wherein the second submatrix in the second region is composed of four square block submatrices, one of which is an all-zero matrix, one of which contains one circulant permutation matrix in each row-block and each column-block, and two of which are square invertible submatrices, vertically concatenated with an all-zero submatrix, the method further comprising:

expanding a first inverse of a first square invertible submatrix block-column wise into a first secondary matrix composed only of circulant permutation matrices;

expanding a second inverse of a second square invertible submatrix block-column wise into a second secondary matrix composed only of circulant permutation matrices;

computing a first part of the set of redundancy bits by recursive accumulation of temporary bits, traversing the block-columns of the first expanded secondary matrix and storing them in a memory;

updating the temporary parity check bits of the first part of the second region using the first part of the set of redundancy bits, and the square submatrix which contains one circulant permutation matrix in each row-block and each column-block; and computing a second part of the set of redundancy bits by recursive accumulation of temporary parity check bits, traversing the block-columns of the second expanded secondary matrix.

16. The encoding method of claim 15, further comprising a second submatrix in the second region such that the inverses of the two square invertible submatrices are composed of low-weight circulant matrices, and the expanded secondary matrices have a small number of block-columns.

17. The encoding method of claim 16, wherein the maximum weight of circulants matrices composing the inverses of the two square invertible submatrices is 15.

18. An apparatus, comprising:

a circuit configured to:
receive as input a set of information bits;
compute a first set of temporary parity check bits using the set of information bits and a first submatrix of a first region of a parity check matrix of a quasi-cyclic low-density parity check (LDPC) code, the first submatrix composed of columns of a first subset of the parity check matrix;

compute a second set of temporary parity check bits and a first set of redundancy bits using the first set of temporary parity check bits and a second submatrix of a second region of the parity check matrix, the second submatrix composed of columns of a second subset of the parity check matrix; and compute a second set of redundancy bits using the second set of temporary parity check bits from the second region and a third submatrix of a third region of the parity check matrix, the third submatrix composed of columns of a third subset of the parity check matrix;

a merger processor configured to combine the input to the circuit and a sequence of instructions for each of the first, second and third regions;

a set of one or more accumulator processors configured to update the first set of temporary parity check bits or a second set of temporary parity check bits or a first subset of the redundancy bits or a second subset of the redundancy bits, each accumulator comprising:

a memory to store a vector of temporary binary data;
a shifter processor configured to cyclically shift a vector of data according to a circulant permutation matrix multiplication;
a set of shift registers configured to store delayed copies of temporary data; and
an exclusive or (XOR) processor.

19. The apparatus of claim 18, wherein the first submatrix of the first region is organized into a number of generalized layers at least equal to the maximum block-column degree of the parity check matrix, and wherein the number of separate memories is equal to the number of generalized layers, and the number of accumulator processors is equal to the number of generalized layers, the set of accumulator processors configured to:

recursively accumulate the first set of temporary parity check bits;
store the first set of temporary bits in a number of separate memories; and
process circulant permutation matrices belonging to one particular generalized layer.

20. The apparatus of claim 18, wherein the second submatrix of the second region is in the form of a block upper-triangular matrix and organized into generalized layers, where a number of the generalized layers is at least equal to the maximum block column degree of the parity check matrix, the set of accumulator processors configured to:

recursively accumulate the second set of temporary parity check bits of the second region;
store the second set of temporary parity check bits in a number of separate memories, wherein the number of separate memories is equal to a number of generalized layers; and
concurrently compute the first subset of redundancy bits using the diagonal blocks of the second submatrix of the second region by simple evaluation of the memories content, wherein the number of accumulator processors is equal to the number of generalized layers, and each accumulator processor processes circulant permutation matrices belonging to one particular generalized layer.

21. The apparatus of claim 18, wherein the third submatrix of the third region is formed from a vertical concatenation of an invertible square submatrix with an all-zero submatrix, the circuit further configured to:
  expand the inverse of the invertible square submatrix of the third region block-column-wise into a secondary matrix composed only of circulant permutation matrices; and
  compute the second subset of redundancy bits by recursive accumulation of temporary bits, traversing the block-columns of the expanded secondary matrix, wherein each accumulator processes the data for a single block-row of the expanded secondary matrix for the inverse of the square invertible submatrix, and the memory in each accumulator stores concurrently the temporary parity check values from the second region processing and the accumulated values of the redundancy bits at different addresses.

22. The apparatus of claim 18, wherein a third submatrix in the third region is composed of four square block submatrices, one of which is an all-zero matrix, one of which contains one circulant permutation matrix in each row-block and each column-block, and two of which are square invertible submatrices, vertically concatenated with an all-zero submatrix, the circuit further configured to:
  expand a first inverse of a first invertible square submatrix block-column wise into a first secondary matrix composed only of circulant permutation matrices;
  expand a second inverse of a second invertible square submatrix block-column wise into a second secondary matrix composed only of circulant permutation matrices;
  compute a first part of the second subset of redundancy bits by recursive accumulation of temporary bits, traversing the block-columns of the first expanded secondary matrix and storing them in a memory;
  update the temporary parity check bits of the first part of the third region using the first part of the second subset of redundancy bits, and the square submatrix which contains one circulant permutation matrix in each row-block and each column-block; and
  compute a second part of the second subset of redundancy bits by recursive accumulation of temporary bits, traversing the block-columns of the second expanded secondary matrix, wherein each accumulator processes the data for a single block-row of the first expanded secondary matrix by:
    (a) passing the data through the shifter processors configured with the square submatrix containing one circulant permutation matrix in each row-block and each column-block;
    (b) processing the data for a single block-row of the second expanded secondary matrix; and
    (c) storing concurrently the temporary parity check values from the second region processing in memory, wherein the accumulated values of the redundancy bits are at different addresses.

23. An apparatus, comprising:
a circuit configured to:
receive as input a set of information bits;
compute a set of temporary parity check bits using the set of information bits and a first submatrix of a first region of a parity check matrix of a quasi-cyclic low-density parity check (LDPC) code, the first submatrix composed of columns of a first subset of the parity check matrix;
compute a set of redundancy bits using the set of temporary parity check bits and a second submatrix of a second region of the parity check matrix, the second submatrix composed of columns of a second subset of the parity check matrix;
a merger processor configured to combine the input to the circuit and a sequence of instructions for each of the first and second regions;
a set of one or more accumulator processors configured to update a set of temporary parity check bits or a set of redundancy bits, each accumulator comprising:
  a memory to store a vector of temporary binary data;
  a shifter processor configured to cyclically shift a vector of data according to a circulant permutation matrix multiplication;
  a set of shift registers configured to store delayed copies of temporary data; and
  an exclusive or (XOR) processor.

24. The apparatus of claim 23, wherein the second submatrix of the second region is formed from a vertical concatenation of an invertible square submatrix with an all-zero submatrix, the circuit further configured to:
  expand the inverse of the invertible square submatrix of the second region block-column-wise into a secondary matrix composed only of circulant permutation matrices; and
  compute the set of redundancy bits by recursive accumulation of temporary bits, traversing the block-columns of the expanded secondary matrix, each accumulator processes the data for a single block-row of the expanded secondary matrix for the inverse of the square invertible submatrix, and the memory in each accumulator stores concurrently the temporary parity check values from the second region processing and the accumulated values of the redundancy bits at different addresses.

25. The apparatus of claim 23, wherein a second submatrix in the second region is composed of four square block submatrices, one of which is an all-zero matrix, one of which contains one circulant permutation matrix in each row-block and each column-block, and two of which are square invertible submatrices, vertically concatenated with an all-zero submatrix, the circuit further configured to:
  expand a first inverse of a first invertible square submatrix block-column wise into a first secondary matrix composed only of circulant permutation matrices;
  expand a second inverse of a second invertible square submatrix block-column wise into a second secondary matrix composed only of circulant permutation matrices;
  compute a first part of the set of redundancy bits by recursive accumulation of temporary bits, traversing the block-columns of the first expanded secondary matrix and storing them in a memory;
  update the temporary parity check bits of the first part of the second region using the first part of the set of redundancy bits, and the square submatrix which contains one circulant permutation matrix in each row-block and each column-block; and
  compute a second part of the set of redundancy bits by recursive accumulation of temporary bits, traversing the block-columns of the second expanded secondary matrix, and each accumulator processes the data for a single block-row of the first expanded secondary matrix by:
    (a) passing the data through the shifter processors configured with the square submatrix containing one circulant permutation matrix in each row-block and each column-block;

(b) processing the data for a single block-row of the second expanded secondary matrix; and
(c) storing concurrently the temporary parity check values from the second region processing in memory, wherein the accumulated values of the redundancy bits are at different addresses.

* * * * *